(12) United States Patent
Drewes

(10) Patent No.: US 7,402,833 B2
(45) Date of Patent: *Jul. 22, 2008

(54) MULTILAYER DIELECTRIC TUNNEL BARRIER USED IN MAGNETIC TUNNEL JUNCTION DEVICES, AND ITS METHOD OF FABRICATION

(75) Inventor: Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 427 days.

This patent is subject to a terminal disclaimer.

(21) Appl. No.: 11/106,509

(22) Filed: Apr. 15, 2005

(65) Prior Publication Data

US 2005/0173698 A1    Aug. 11, 2005

Related U.S. Application Data

(60) Continuation of application No. 10/674,549, filed on Oct. 1, 2003, now Pat. No. 6,900,455, which is a division of application No. 10/165,301, filed on Jun. 10, 2002, now Pat. No. 6,849,464.

(51) Int. Cl.
  H01L 29/06  (2006.01)
  H01L 29/08  (2006.01)
  H01L 39/00  (2006.01)

(52) U.S. Cl. ............... 257/30; 257/637; 257/E49.001
(58) Field of Classification Search ............ 257/30, 257/637, E49.001
  See application file for complete search history.

(56) References Cited

U.S. PATENT DOCUMENTS

| 6,347,049 | B1 | 2/2002 | Childress et al. |
| 6,617,173 | B1 | 9/2003 | Sneh |
| 6,900,455 | B2 * | 5/2005 | Drewes ............... 257/30 |
| 2002/0153579 | A1 | 10/2002 | Yamamoto |
| 2003/0003635 | A1 | 1/2003 | Paranjpe et al. |

* cited by examiner

Primary Examiner—Ngan Ngo
(74) Attorney, Agent, or Firm—Dickstein Shapiro LLP

(57) ABSTRACT

A multilayer dielectric tunnel barrier structure and a method for its formation which may be used in non-volatile magnetic memory elements comprises an ALD deposited first nitride junction layer formed from one or more nitride monolayers i.e., AlN, an ALD deposited intermediate oxide junction layer formed from one or more oxide monolayers i.e., $Al_xO_y$, disposed on the first nitride junction layer, and an ALD deposited second nitride junction layer formed from one or more nitride monolayers i.e., AlN, disposed on top of the intermediate oxide junction layer. The multilayer tunnel barrier structure is formed by using atomic layer deposition techniques to provide improved tunneling characteristics while also providing anatomically smooth barrier interfaces.

50 Claims, 17 Drawing Sheets

MULTILAYER DIELECTRIC TUNNEL BARRIER USED IN MAGNETIC TUNNEL JUNCTION DEVICES, AND ITS METHOD OF FABRICATION

CROSS-REFERENCE TO RELATED APPLICATIONS

This application is a continuation of U.S. patent application Ser. No. 10/674,549, filed on Oct. 1, 2003 now U.S. Pat. No. 6,900,455, which in turn is a divisional application of U.S. patent application Ser. No. 10/165,301, filed on Jun. 10, 2002, which issued as U.S. Pat. No. 6,849,464 on Feb. 1, 2005. The disclosures of both U.S. patent applications are incorporated in their entirety by reference herein.

BACKGROUND OF THE INVENTION

1. Field of the Invention

This invention relates generally to the field of semiconductor memory, sensor applications and logic devices. The invention relates more specifically to a multilayer dielectric tunnel barrier used in magnetic tunnel junction devices, and its method of fabrication.

2. Description of the Related Art

Recently, magnetoresistive random access memory (MRAM) devices have been developed as possible use for data storage. The nonvolatility, fast access times, and less complex structure of MRAM offers some advantages over DRAM and FLASH memory devices.

The two most critical layers in an MRAM memory cell are the tunnel barrier, which is often formed with $Al_xO_y$, i.e., $Al_2O_3$, and the sense (free) layer. The tunnel barrier is very thin and the tunneling resistance is exponentially dependent on its thickness. This strong dependence on thickness makes it difficult to consistently produce devices with nearly the same resistance over typical substrate sizes currently used in memory manufacturing processes.

A magnetic tunnel junction device, in its simplest form, is two ferromagnetic layers separated by the tunnel barrier or dielectric film. The two ferromagnetic layers, together with the tunnel barrier, act to pass certain electrons preferentially based on their respective spins. One ferromagnetic layer has a pinned magnetic field whereas the other ferromagnetic layer has a magnetic field which freely switches directions based on the applied magnetic programming signal.

For proper device operation, the tunnel barrier must be free of pinholes, very smooth, and uniform over the entire wafer. Small variations in the thickness of the tunnel barrier layer such as over the surface of a wafer, can result in large variations in memory cell resistance. Typically, an $Al_xO_y$ tunnel barrier layer is fabricated by depositing a metallic aluminum layer and subsequently oxiding this layer by one of several methods. Oxidation can occur by plasma oxidation, oxidation in air, oxidation by glow-discharge plasma, atomic-oxygen exposure, and ultraviolet-stimulated oxygen exposure.

However, the oxidation process creates anomalous effects. Overoxidation or underoxidation occurring on the aluminum layer reduces the magnetoresistance ratio. The magnetoresistance ratio is typically the change of resistance proportional to the square of the magnetic field. Overoxidation results in oxidation of the magnetic electrode beneath the tunnel barrier; whereas, underoxidation leaves metallic aluminum at the bottom of the tunnel barrier. In addition, roughness at the tunnel barrier interfaces lowers the magnetoresistance ratio dramatically, due to partial shorts or tunneling hot spots. Thus, producing a magnetic tunnel junction material with good resistance uniformity over an entire wafer is challenging. Many techniques have been employed to improve the aluminum metal layer thickness uniformity, such as forming the $Al_xO_y$ tunnel barrier with air, reactive sputtering, plasma oxidation with plasma source, plasma oxidation, plasma oxidation with power introduced from the target side, and plasma oxidation with power introduced from the substrate side.

Another problem arises when the magnetic tunnel junction material is exposed to temperatures greater than 300° C. The magnetoresistance ratio begins to degrade at 300° C. and drops off sharply at 400° C. as a result of increasing resistance. In addition, as bit sizes are reduced, a challenge arises in producing magnetic tunnel junction material with very low resistance-area products. The resistance of the magnetic tunnel junction material, expressed as the resistance-area, has been shown to vary exponentially with both the metal layer's thickness, oxidation dose for thickness, and dose values that produce a high magnetoresistance ratio. Thus, obtaining a thinner tunnel barrier without reducing the magnetoresistance ratio is one of the key factors to achieving a low resistance-area product or device.

Accordingly, a need exists for an improved tunnel barrier film which has lower resistance and in which the tunnel barrier height and final overall barrier resistance can be modified. Additional needs exist for an improved tunnel barrier film with reduced chances of pinhole formation and which can work in temperatures greater than 300° C. An additional need also exists for a tunnel barrier film having reduced roughness at the tunnel-barrier interfaces and which mitigates oxidation problems.

BRIEF SUMMARY OF THE INVENTION

The present invention provides an ALD deposited multilayer dielectric tunnel barrier film for use in magnetic tunnel junction devices, and a method of fabrication therefor. The tunnel barrier film has reduced resistance and good deposition conformality. An ALD deposited tunnel barrier film, in accordance with the invention, is formed of alternating layers of sequence with plasma or thermal densification steps, to create controlled resistance tunnel barrier layers, which reduce or eliminate pinhole formation and breakdown areas in the films.

The method aspect of the invention comprises providing an oxide layer, on a first nitride layer, and a second nitride layer on the oxide insulation area. The first nitride layer is disposed on a semiconductor substrate containing a first ferromagnetic film. While the second nitride layer interfaces with a second ferromagnetic film. By conducting the formation of the multilayer dielectric tunnel barrier through atomic layer deposition reactions coupled with thermal anneals, plasma processing, and densification techniques; a highly improved and controlled multilayer tunnel barrier can be achieved which provides a higher breakdown point, lower pinhole occurrences, and good tunneling characteristics for magnetic tunnel junctions.

The enhanced multilayer tunnel barrier structure is produced by alternating layers of nitride i.e., AlN, and oxide i.e., $Al_xO_y$, through atomic layer deposition reactions. The atomic layer deposition reactions allow precise control over the thickness of the alternating layers of nitride and oxide. The thickness of these alternating nitride and oxide layers can be utilized to change the final magnetoresistance of the barrier or barrier height, and reduce the chances of pinhole formation. Furthermore, utilizing ALD processes allows formation of the tunnel barrier structure to occur at temperatures below 300° C., ensuring stability of the alternating layers.

Therefore, the present invention provides a multilayer dielectric tunnel barrier that has a substantially reduced overall resistance than that associated with conventional structures and methods, while permitting precise tailoring of the thicknesses of the various layers in the tunnel barrier structure. The present invention also provides for memory devices which have reduced pinholing; improved magnetic characteristics, by reducing the occurrence of oxidation of the ferromagnetic materials on either side of the barrier; and anatomically smooth tunnel barrier layer interfaces.

BRIEF DESCRIPTION OF THE DRAWINGS

These and other features and advantages of the present invention will become more fully apparent from the following detailed description of exemplary embodiments of the invention which are provided in connection with the accompanying drawings.

DETAILED DESCRIPTION OF THE INVENTION

The present invention will be understood from the following detailed discussion of the exemplary embodiments which is presented in connection with the accompanying drawings.

The present invention provides a multilayer dielectric tunnel barrier used in magnetic tunnel junction devices and its method of fabrication. The multilayer film has lower barrier layer resistance, is very conformal, and can be made as a thicker or thinner film with fewer pinholes.

In the following description, specific details such as layer thicknesses, process sequences, and material compositions are set forth to provide a complete understanding of the present invention. However, it will be obvious to one skilled in the art that the present invention can be employed without using such specific details. In addition, in order for a simplified description, techniques, processes, and equipment that are well-known in the art have not been described in detail.

For purposes of the present invention, the tunnel barrier is defined as the dielectric portion between two ferromagnetic layers. The combination of alternating layers of nitride, oxide, and nitride, deposited using ALD techniques, form the tunnel barrier. The electrical barrier height may be altered by changing the relative thicknesses of the nitride and oxide layers. The tunnel barrier thickness is changed simply by the number of ALD deposition steps used in forming the alternating nitride and oxide layers.

Figure 1:
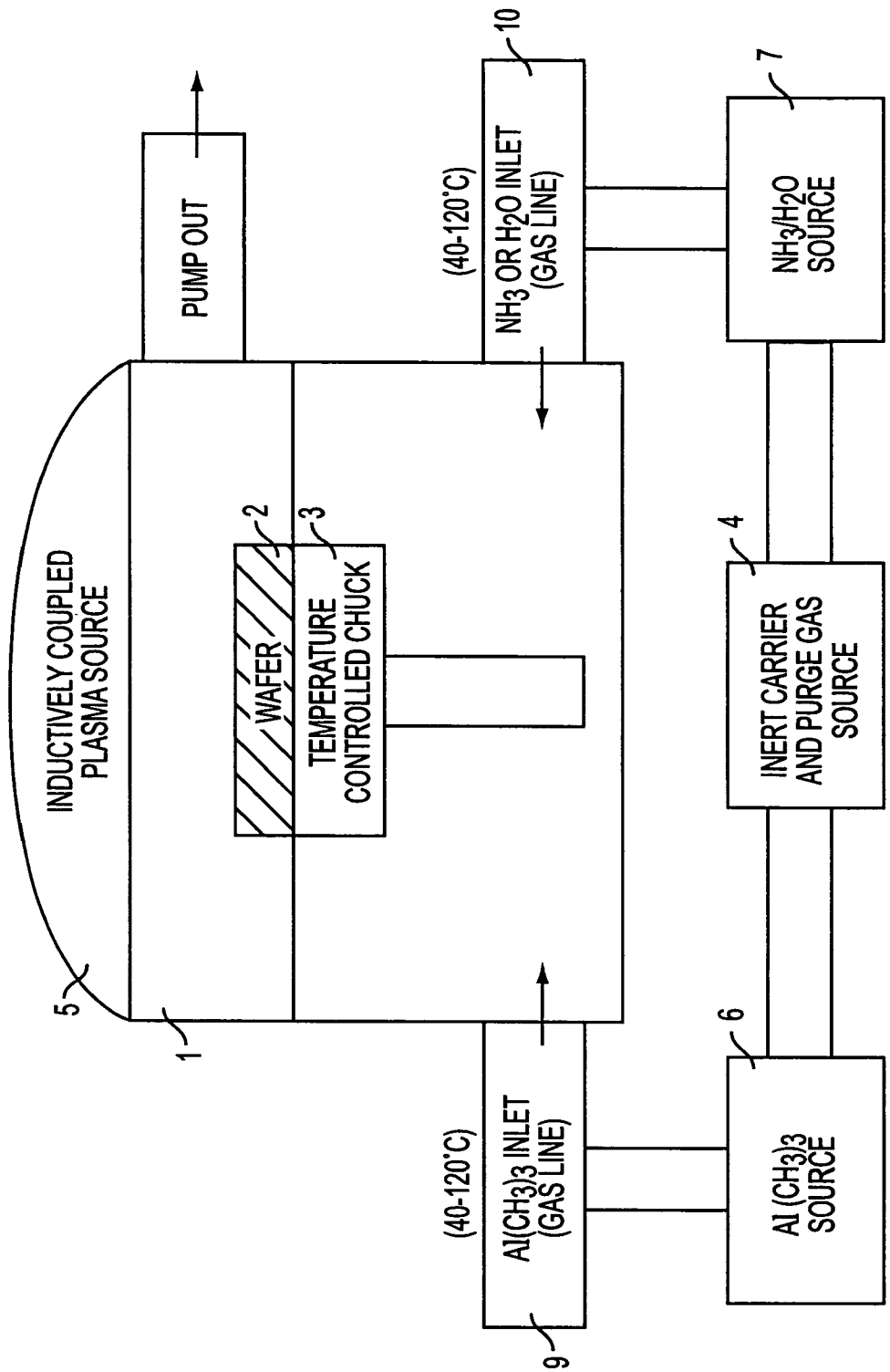
FIG. 1 is a graphical illustration of a reaction vessel used in carrying out the method aspects of the invention and prior to commencing the different reaction sequences.

FIG. 1 is a graphical illustration of a reaction vessel 1 which can be employed for magnetic tunnel junction barrier film formation. A semiconductor wafer 2 is disposed on a temperature controlled chuck 3. Heated gas lines 9 and 10 are utilized to introduce gases into the reaction vessel 1 during fabrication of the tunnel barrier layers. The temperature controlled chuck 3 temperature can range from approximately 25° C. to approximately 250° C. The semiconductor wafer 2 has been previously processed to the point where a first ferromagnetic layer is provided on the exposed wafer surface.

The invention provides a first nitride junction layer on the first ferromagnetic layer. For purposes of a simplified description, the invention will be described below with use of AlN as comprising the first and second nitride junction layers. However, nitride layers such as $Si_xN_y$, TiN, HfN, TaN, and other alternative nitride layers known in the art, can also be used to form the first and second nitride junction layers. In addition, although the reactant utilized in this invention is described as $NH_3$ to form the first and second nitride junction layers, other reactants well-known in the art such as $N_2$ (plasma) or N from an atomic source (essentially a plasma that splits $N_2$ into N) can be utilized with equal effectiveness. Furthermore, although TMA is the reactant utilized to form the first and second nitride junction layers, other reactants well-known in the art such as Dimethyl Amine Alane (DMAA), $Al(CH_3)_2NH_2$ can be used with equal effectiveness.

To begin fabrication of a monolayer of the first nitride junction layer, in the first processing step, the reaction vessel 1 is first pumped down to a pressure at least less than 0.01 Torr i.e., a vacuum environment. Heated gas line 9 allows an initial reactant such as $Al(CH_3)_3$ (TMA) 6 to enter reaction vessel 1. Heated gas line 10 allows a second reactant to enter reaction vessel 1, such as water ($H_2O$) 7 or ammonia ($NH_3$) 7. However, either heated gas line 9 or 10 may be utilized to send the initial reactant into the reaction vessel 1.

Gas lines 9 and 10 are heated to a temperature of approximately 40° C. to approximately 120° C. depending upon the reactants utilized. For instance, heated gas line 10, when carrying $H_2O$ 7, should have a temperature at least greater than 100° C. to help avoid condensation of the reactant in heated gas line 10. Whereas, heated gas line 9, when carrying TMA 6, would only need to be heated from approximately 50° C. to approximately 60° C. An additional example is if $O_3$ is used as a reactant, the heated gas line utilized would not require a temperature above 50° C. In essence, the temperature of the heated gas line utilized, just needs to be high enough to avoid condensation of the reactants in the heated gas line.

Either TMA 6, from heated gas line 9, or $NH_3$ 7 from heated gas line 10 can be introduced as the first reactant into reaction vessel 1. If TMA 6 is introduced as the initial reactant through heated gas line 9, $NH_3$ 7 is then introduced as the second reactant through heated gas line 10 to form an AlN monolayer. Whereas, if $NH_3$ 7 is introduced as the initial reactant through heated gas line 10, TMA 6 is then introduced as the second reactant through heated gas line 9 to form the AlN monolayer. As described below, alternating depositions of the first reactant and second reactant will result in a nitride junction layer i.e., an AlN film, of a desired thickness. For purposes of a simplified description, the invention will be described below with use of TMA 6 as the initial reactant. However, the invention is equally effective if $NH_3$ 7 is used as the initial reactant.

Figure 2A:
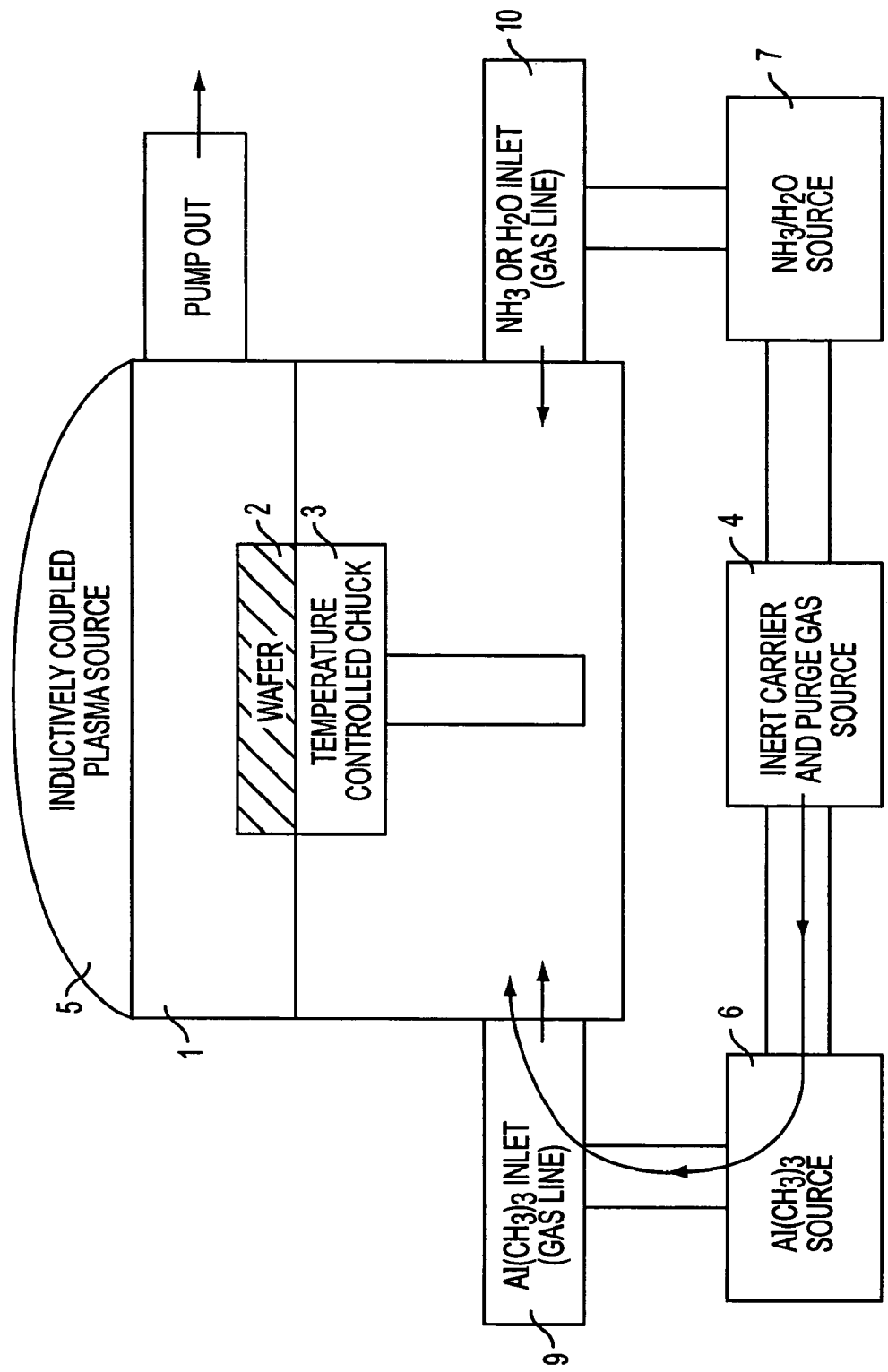
FIG. 2A is a graphical illustration of the operation of the FIG. 1 reaction vessel carrying out a first processing sequence.

Referring now to FIG. 2A, after the reaction vessel 1, containing the semiconductor wafer 2, is pumped down to a pressure at least less than 0.01 Torr, TMA 6 is introduced at a rate of approximately 10 sccm to approximately 50 sccm through heated gas line 9 into the reaction vessel 1. The TMA 6 is transported to the semiconductor wafer surface 2 by an inert carrier gas 4 such as Ar (Argon). However, other inert carrier gases that are non-reactive can also be utilized with equal effectiveness. Wafer 2 is dosed with a short pulse of TMA 6 to adsorb a continuous monolayer of TMA 6 on the wafer 2 surface. During TMA 6 adsorption, the reaction vessel 1 is held at a pressure of approximately 0.1 Torr to approximately 200 Torr, for a period of approximately 1 second to approximately 10 seconds after deposition of Al as a monolayer from the TMA 6 reactant.

Figure 2B:
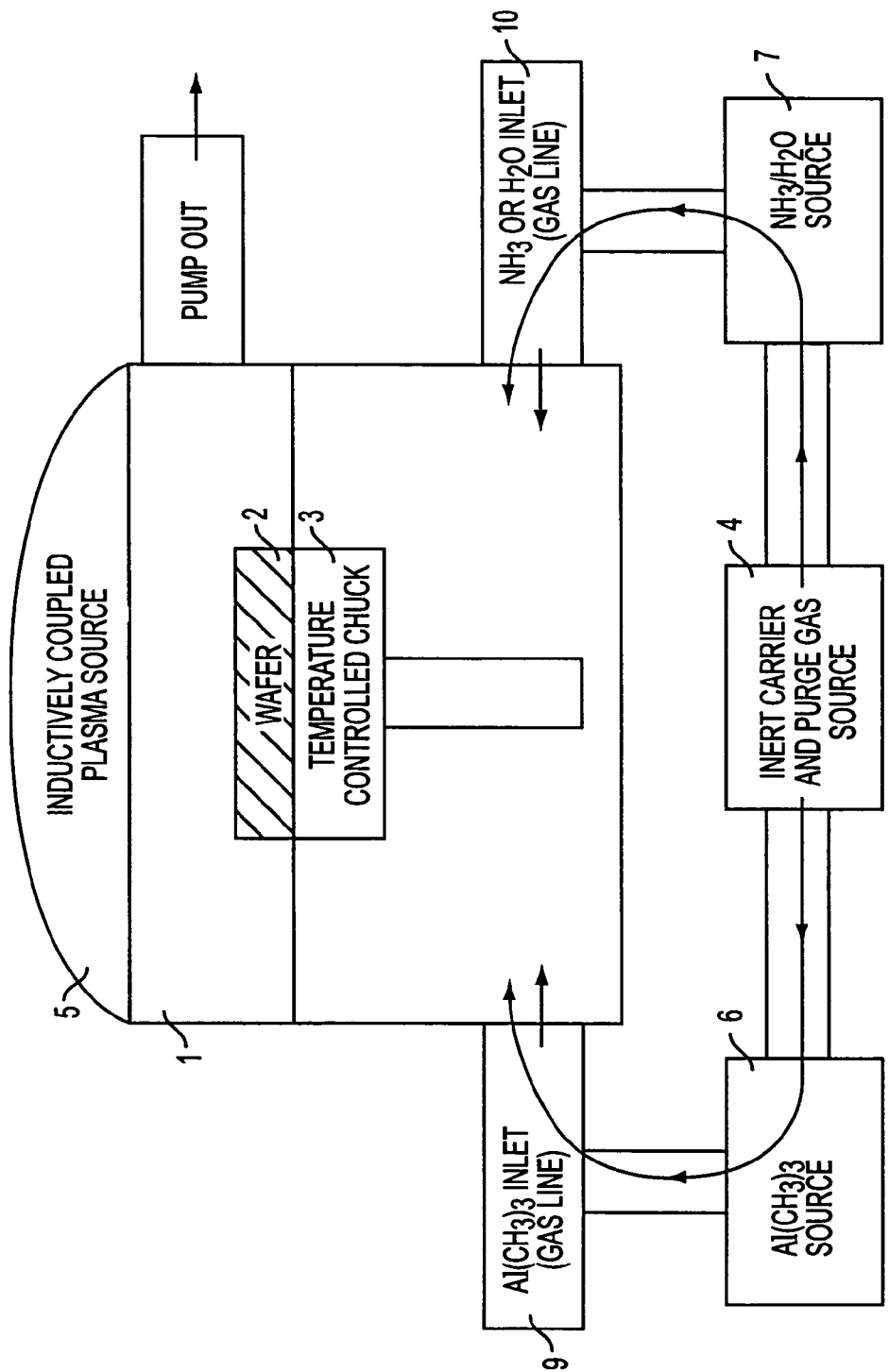
FIG. 2B is a graphical illustration of purging the FIG. 1 chamber after the first processing sequence.

Referring now to FIG. 2B, a non-reactive gas 4 such as Ar, is passed through heated gas lines 9 and 10 to purge heated gas lines 9 and 10 and the reaction vessel 1 of residual reactant i.e., TMA 6. Although Ar is utilized as the non-reactive purge gas, any non-reactive or inert gas may be utilized as the purge gas with equal effectiveness. The non-reactive gas 4, is introduced into the reaction vessel 1 through heated gas lines 9 and 10 at a rate of approximately 50 sccm. Although FIG. 2B illustrates a flow of purge gas through heated gas lines 9 and 10 which provides a quicker purge of the reaction vessel 1 and heated gas lines 9 and 10, it is also possible to supply the non-reactive purge gas only through the heated gas line that supplied the initial reactant; here, in heated gas line 9, in the process step shown in FIG. 2A. Whereas if $NH_3$ 7 is the initial reactant, the non-reactive purge gas 4 can be supplied through heated gas line 10.

Figure 2C:
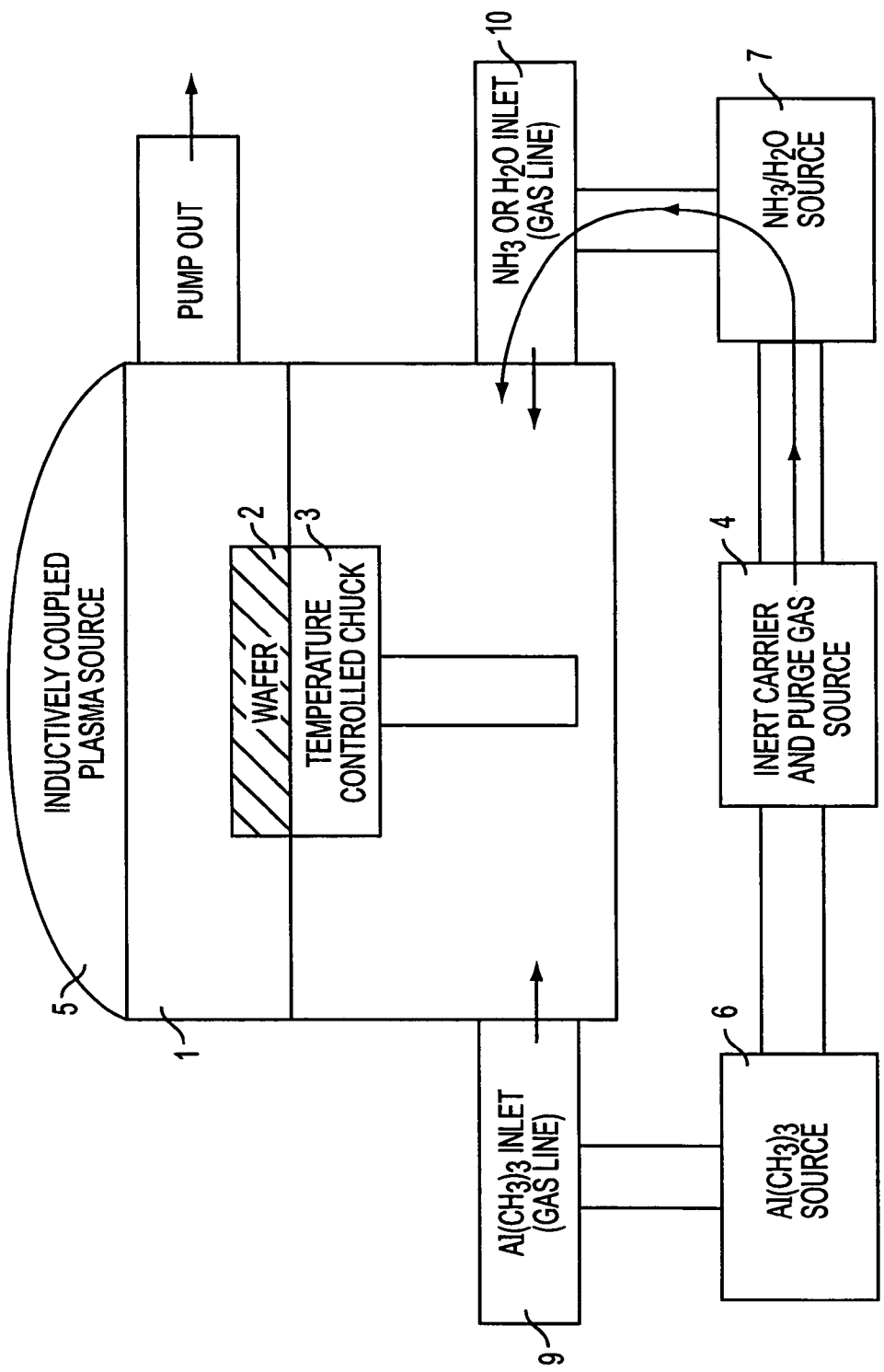
FIG. 2C is a graphical illustration of operating the FIG. 1 reaction vessel carrying out a second processing sequence.

After the purge depicted in FIG. 2B, FIG. 2C graphically illustrates that an inert carrier gas 4 such as Ar, is passed through heated gas line 10 carrying a second reactant i.e., $NH_3$ 7 into reaction vessel 1. $NH_3$ 7 is introduced at a rate of approximately 10 sccm to approximately 50 sccm into reaction vessel 1. The reaction vessel 1 is held at a pressure of approximately 0.1 Torr to approximately 200 Torr, for a period of approximately 1 second to approximately 10 seconds during introduction of the second reactant into reaction vessel 1. $NH_3$ 7 provides nitrogen atoms which are deposited as a monolayer on the wafer 2 and bonds with the Al atoms previously deposited from the first processing sequence; thus, providing a monolayer of AlN on the surface of wafer 2.

Figure 2D:
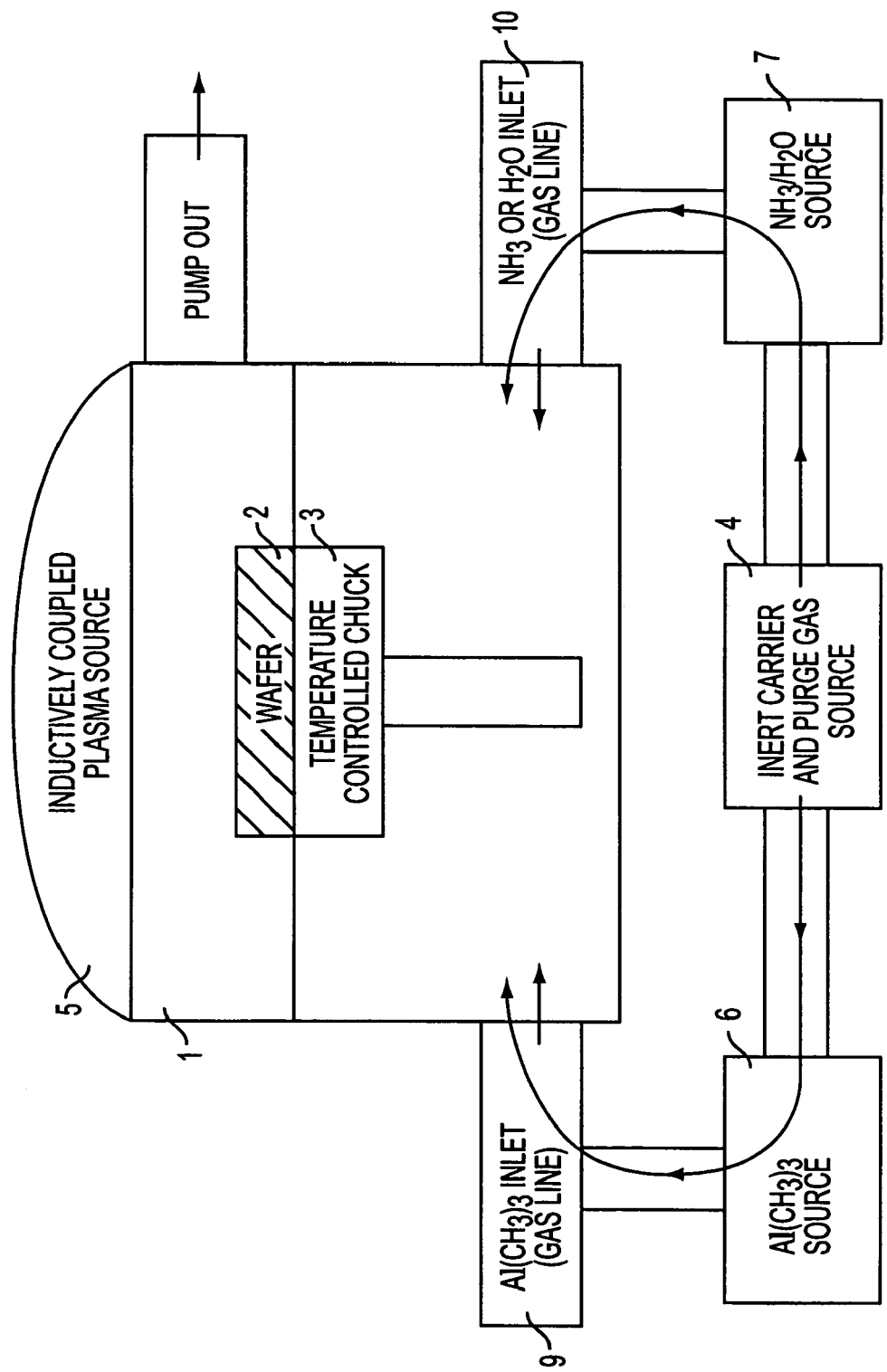
FIG. 2D is a graphical illustration of purging the FIG. 1 chamber after the second processing sequence.

After nitradation from the introduction of $NH_3$ 7, reaction vessel 1 is purged again by passing a non-reactive gas 4 such as Ar, through heated gas lines 9 and 10 in order to purge heated gas lines 9 and 10 and reaction vessel 1 as shown in FIG. 2D. The non-reactive gas 4 is introduced at a rate of approximately 50 sccm. This step removes the reaction byproduct i.e., $CH_4$ and residual $NH_3$ 7, from reaction vessel 1 and heated gas lines 9 and 10. Although FIG. 2D illustrates the inert purge gas 4 passing through both heated gas lines 9 and 10 into reaction vessel 1 for a faster purge; it is also possible to just pass the inert purge gas 4 through the heated gas line that introduced the second reactant. The resulting interaction between TMA 6 that was introduced in FIG. 2A and $NH_3$ 7 introduced in FIG. 2C, results in a monolayer of reacted AlN which is $AlNH_2$ and some AlNH. $AlNH_2$ and AlNH can then be subsequently reduced to Al—N—Al upon reaction with another TMA 6 dose by proceeding again with the processing sequences depicted in FIGS. 2A-2B.

Figure 2E:
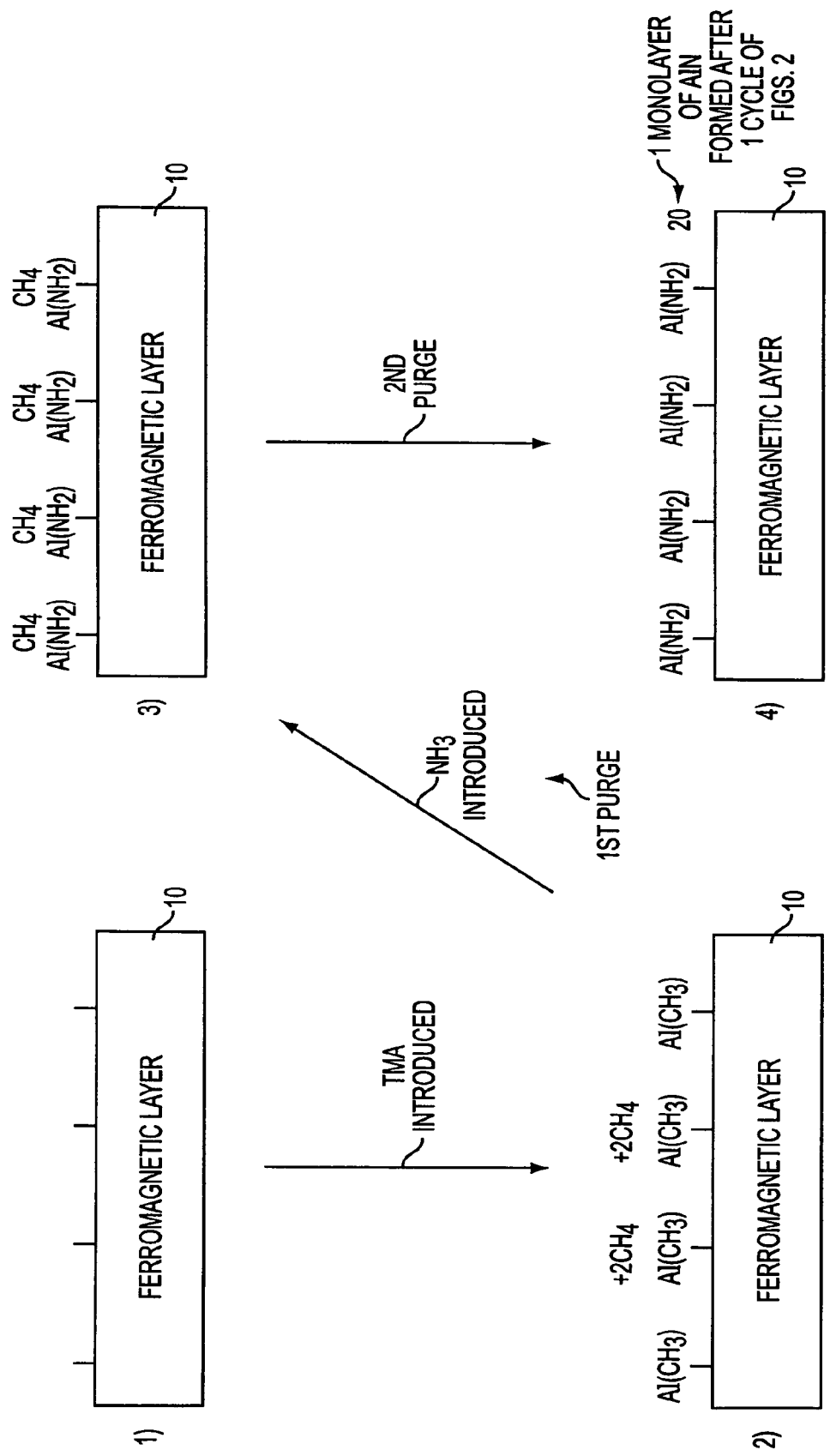
FIG. 2E is a cross-sectional view of the formation of a first nitride junction layer conducted in accordance with the present invention through methods depicted in FIGS. 2A-2D.

FIG. 2E is a cross-sectional view of the formation of the first nitride junction layer (AlN) on a first ferromagnetic layer after one cycle of the processing sequences depicted in FIGS. 2A-2D are carried out. TMA is not a stable compound and automatically reacts if exposed to the atmosphere. Thus, the processes depicted in FIGS. 2A-2D, must be carried out in a vacuum-like atmosphere to prevent TMA from prematurely reacting. TMA's volatility is an additional reason that reaction vessel 1 and heated gas lines 9 and 10 must be purged prior to introducing a second reactant in the processing sequences depicted in FIGS. 2B and 2D.

Initially, TMA is deposited on the first ferromagnetic layer (FIG. 2E(1)) provided on the wafer 2 as depicted in FIG. 2E(2). TMA remains stable and non-volatile in reaction vessel's 1 vacuum-like environment and upon attachment goes to $Al(CH_3)_2$. Referring now to FIG. 2E(3), which depicts the formation of $AlNH_2$; the introduction of the second reactant $NH_3$, causes the methyl groups of TMA to disassociate from Al. As mentioned previously, Dimethyl Amine Alane (DMAA), $Al(CH_3)_2NH_2$ can also be used with equal effectiveness in forming the AlN part of the barrier. The methyl groups disassociate from TMA since the bond formation of Al—N is favorable over the Al—C bond (i.e., liberates energy upon formation driving the bond formation reaction). The resulting H from $NH_3$ bonds to the disassociated methyl groups of TMA to form the reaction byproduct $CH_4$. Reaction vessel 1 and heated gas lines 9 and 10 are then purged as depicted in FIG. 2D. This results in residual unreacted $NH_3$ and $CH_4$ byproducts to be expunged from reaction vessel 1 and the wafer 2 surface leaving a monolayer of $AlNH_2$ and AlNH to be reacted with another TMA molecule building Al—N—Al layers forming a pristine AlN film. The surface chemical reactions in forming an AlN monolayer are well-known in the art.

FIGS. 2A-2E respectively illustrates one continuous monolayer of reacted AlN deposited on wafer 2 after one cycle of the processing sequences depicted in FIGS. 2A-2D has been completed. The processing sequences depicted in FIGS. 2A-2D can be repeated to form additional monolayers of AlN to achieve the desired thickness of the first nitride junction layer i.e., AlN. For instance, a monolayer of AlN on the surface will have H or $H_2$ such as AlNH or $AlNH_2$, but when reacted with another layer of TMA the monolayer of AlN goes to Al—N—Al as described previously. Thus, additional monolayers of AlN can easily be fabricated according to the desired thickness.

Although the embodiment of the invention illustrated in FIGS. 2A-2D introduces Al atoms first and then nitrogen atoms second in forming the AlN monolayer, the process can also be modified as noted above, to begin with a nitrogen atom layer and then an Al atom layer. In this case, $NH_3$ 7 is utilized as the initial reactant, depicted in FIG. 2C, in forming the first nitride junction layer (AlN). After the nitrogen atom depositions, reaction vessel 1 is purged as depicted in FIG. 2D. Following the purge, TMA 6 is introduced, as depicted in FIG. 2A, and then reaction vessel 1 is purged again as shown in FIG. 2B to complete one monolayer of AlN.

The processing sequences, depicted in FIGS. 2A-2D, results in an anatomically smooth monolayer of approximately 0.8 to approximately 1 Angstrom (A°) of AlN deposited on the first ferromagnetic layer of wafer 2. As noted, the process flow, depicted in FIGS. 2A-2D, can be repeated any number of times as desired to fabricate additional monolayers of AlN on wafer 2 to achieve the desired thickness of the first nitride junction layer i.e., AlN. Typically, approximately 1 to approximately 68 monolayers of AlN is sufficient to protect the bottom ferromagnetic electrode and form the first nitride junction layer. This results in a first nitride junction layer of a thickness of approximately 0.8 A° to approximately 58 A°. The thickness of the first nitride junction layer can be tailored to provide the required magnetoresistance for any given device.

After its formation, the first AlN nitride junction layer can then be thermally annealed at a temperature of approximately 200° C. to approximately 250° C. This anneal occurs for a duration of approximately one minute to approximately ten minutes in a nitrogen ($N_2$) or oxygen ($O_2$) atmosphere. It is preferred that the first AlN nitride junction layer utilize a $N_2$ atmosphere in a thermal anneal to reduce the chance of oxidation at the first ferromagnetic film layer i.e., the initial ferromagnetic film provided on the semiconductor wafer. As a result of the thermal anneal, the level of impurities in the AlN layer is decreased. Specifically, the thermal annealing process releases any unreacted reactants such as TMA 6, releases the final $CH_3$ groups from the last layer of TMA 6 deposited, and drives out any trapped residual hydrogen in the film from $NH_3$ 7. Therefore, the process of thermally annealing the first AlN nitride junction layer aids in completion of nitride formation and reduces the hydrogen content of the film.

Once the first AlN nitride junction layer is formed to a desired thickness, an intermediate junction layer i.e., an oxide layer, is provided on wafer 2 as depicted in FIGS. 3A-3D. The intermediate junction layer such as an oxide layer, can be comprised of $Al_xO_y$, HfO, $Ta_2O_5$, $SiO_2$, or combinations thereof and other materials well-known in the art. For purposes of a simplified description, the intermediate junction layer i.e., an oxide layer, is described as an $Al_xO_y$ layer. Either TMA 6, from heated gas line 9, or $H_2O$ 7 from heated gas line 10 can be introduced as the first reactant into reaction vessel 1. If TMA 6 is introduced as the first reactant through heated gas line 9, $H_2O$ 7 is then introduced as the second reactant through heated gas line 10 in forming the $Al_xO_y$ layer. Whereas, if $H_2O$ 7 is introduced as the first reactant through heated gas line 10, TMA 6 is then introduced as the second reactant through heated gas line 9 to form an $Al_xO_y$ intermediate junction layer. As described below, alternating depositions of the first reactant and second reactant will result in an intermediate oxide junction layer i.e., an oxide layer ($Al_xO_y$), of a desired thickness provided on the first nitride junction layer (AlN).

For purposes of a simplified description, the invention will be described below with use of TMA 6 as the initial reactant. However, the invention is equally effective if $H_2O$ 7 is used as the initial reactant. Furthermore, for purposes of simplification, the invention will be described below with use of $H_2O$ 7 as the second reactant in forming the $Al_xO_y$ intermediate oxide junction layer. However, other reactants such as $O_3$, $H_2O_2$, and other alternative reactants well-known in the art, can also be used as the second reactant in forming the $Al_xO_y$ intermediate oxide junction layer with equal effectiveness.

Figure 3A:
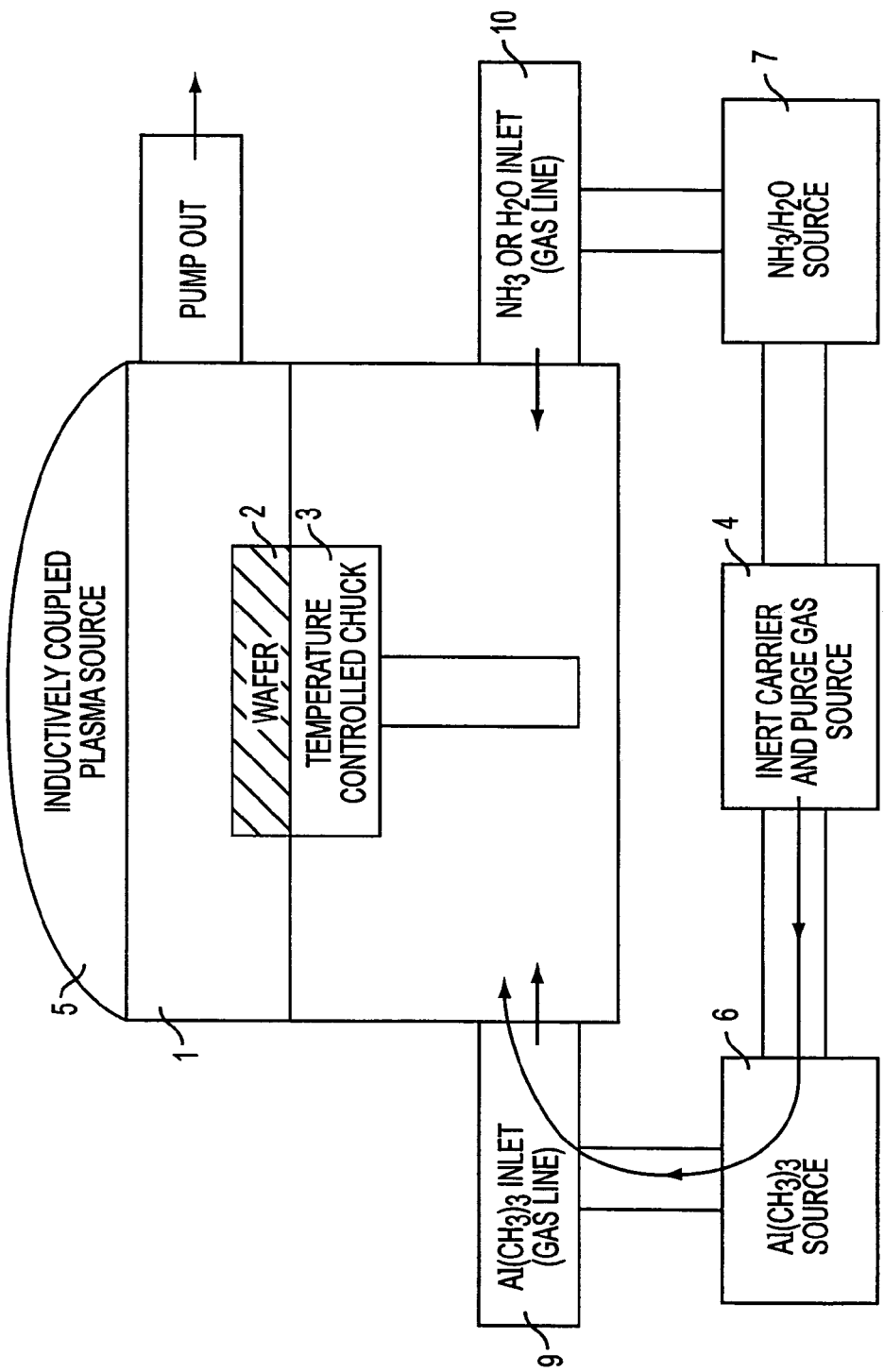
FIG. 3A is a graphical illustration of the first processing sequence in forming an intermediate junction layer.

As shown in FIG. 3A, TMA 6 is introduced as the first reactant through heated gas line 9 into reaction vessel 1 and transported to the semiconductor wafer 2 by an inert carrier gas 4 such as Ar. TMA 6 is introduced at a rate of approximately 10 sccm to approximately 50 sccm as the first reactant through heated gas line 9 into reaction vessel 1. Wafer 2 is dosed with a short pulse of TMA 6 to adsorb a continuous monolayer of Al on the wafer 2 surface. The reaction vessel 1 is held at a pressure of approximately 0.1 Torr to approximately 200 Torr, for a period of approximately 1 second to approximately 10 seconds during Al atom depositions.

Figure 3B:
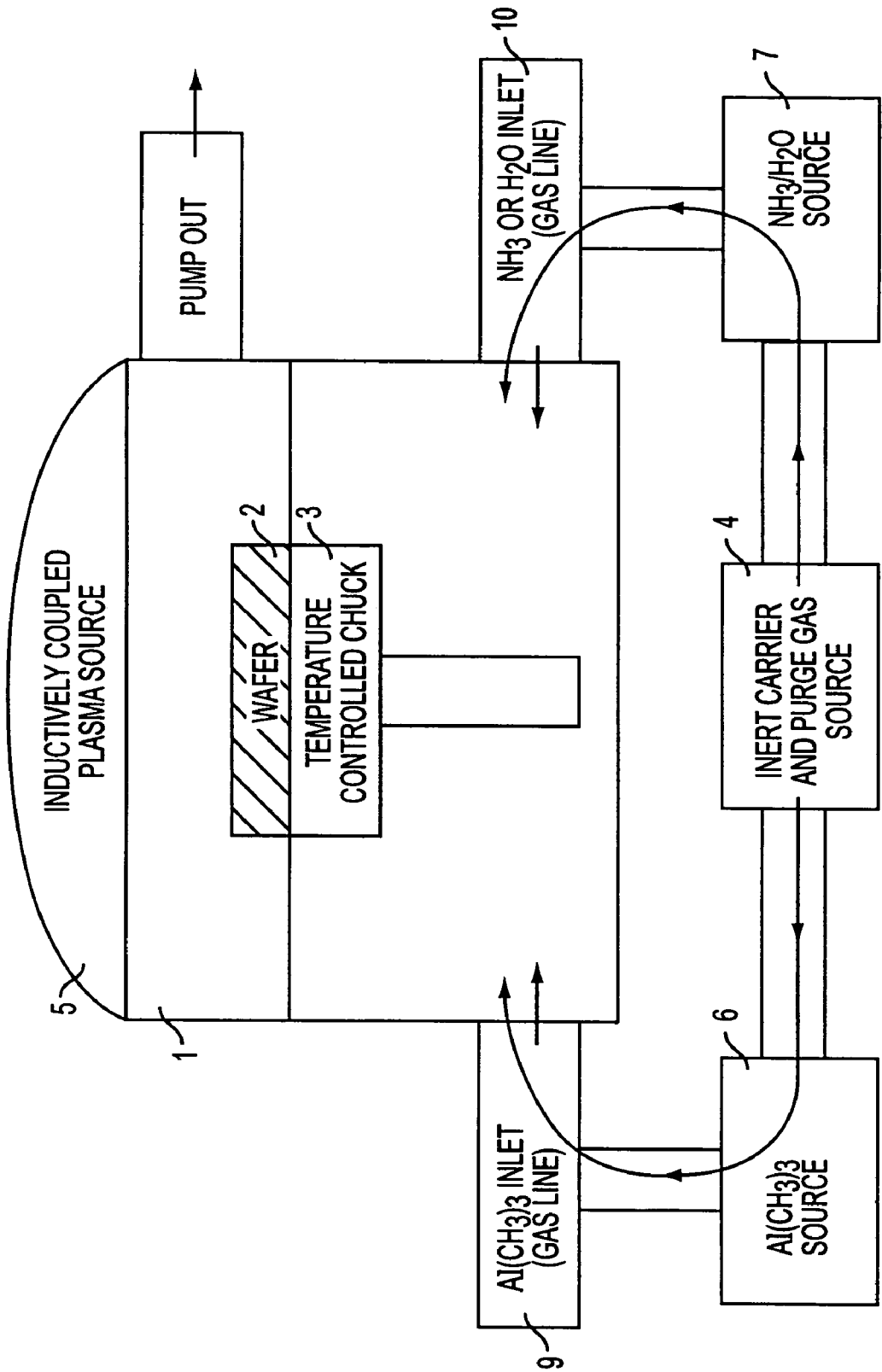
FIG. 3B is a graphical illustration of purging the FIG. 3A chamber after the first processing sequence.

Next, as shown in FIG. 3B, an inert gas 4 i.e., Ar, is passed through heated gas lines 9 and 10, to purge heated gas lines 9 and 10 and reaction vessel 1 of residual TMA 6. The non-reactive gas 4 is introduced into reaction vessel 1 through heated gas lines 9 and 10 at a rate of approximately 50 sccm. Although FIG. 3B illustrates the inert purge gas 4 passing through both heated gas lines 9 and 10 into reaction vessel 1 for a faster purge, it is also possible to just pass the inert purge gas 4 through the heated gas line introducing the first reactant. If $H_2O$ 7 is the initial reactant and TMA 6 is the second reactant, the inert purge gas would then be applied through heated gas line 10.

Figure 3C:
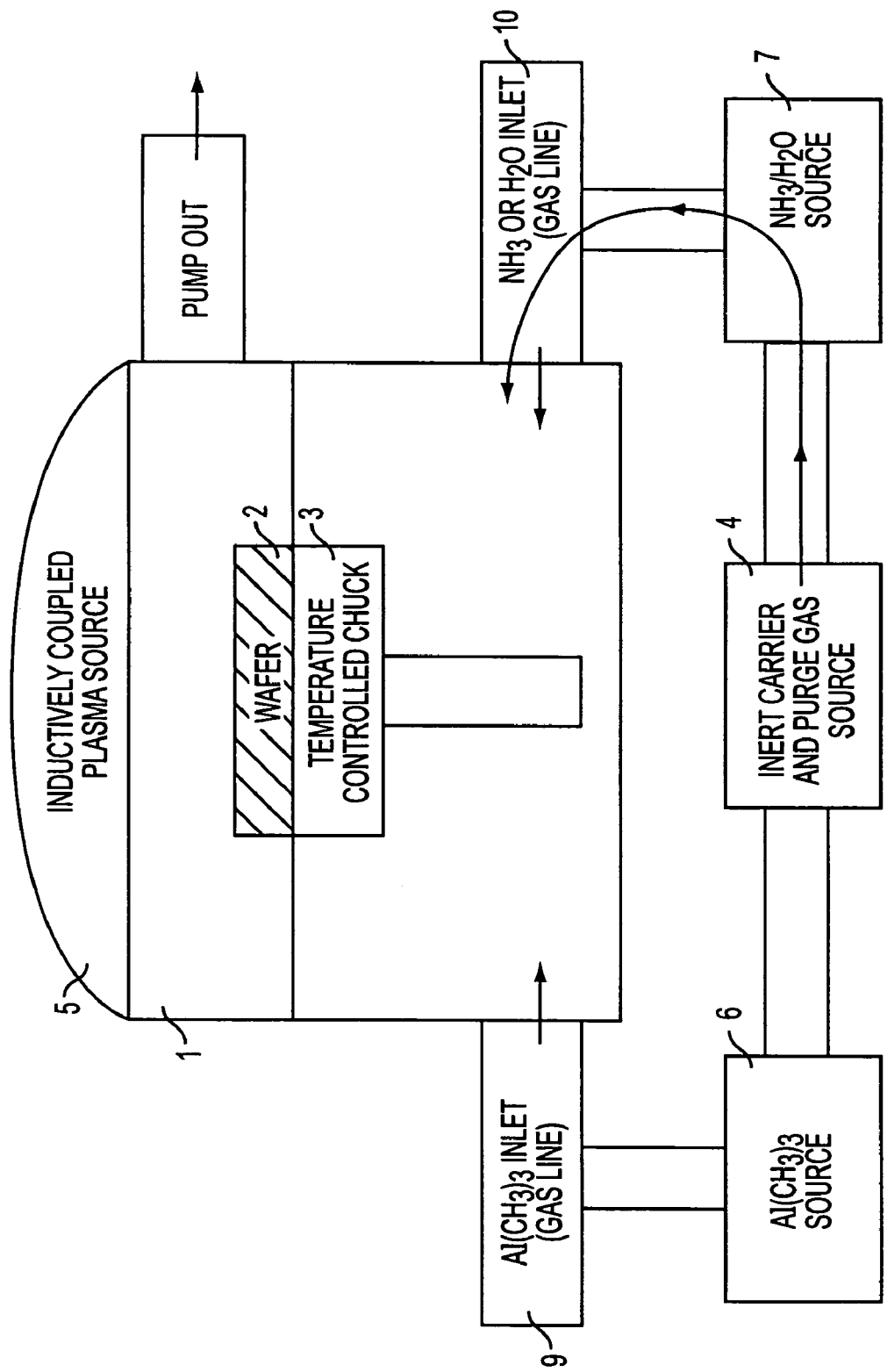
FIG. 3C is a graphical illustration of operating the FIG. 3B reaction vessel carrying out a second processing sequence.

Next, as shown in FIG. 3C, an inert carrier gas 4 i.e., Ar, flows through heated gas line 10 carrying $H_2O$ 7 into reaction vessel 1. $H_2O$ 7 is introduced into reaction vessel 1 at a rate of approximately 10 sccm to approximately 50 sccm. Reaction vessel 1 is held at a pressure of approximately 0.1 Torr to approximately 200 Torr, for a period of approximately 1 second to approximately 10 seconds during the introduction of $H_2O$ 7. $H_2O$ 7 provides oxygen atoms which are deposited as a monolayer on the wafer 2 and bonds with the Al atoms previously deposited from the first processing sequence; thus, providing a continuous monolayer of $Al_xO_y$ on the first nitride junction layer provided on the wafer 2 surface.

Figure 3D:
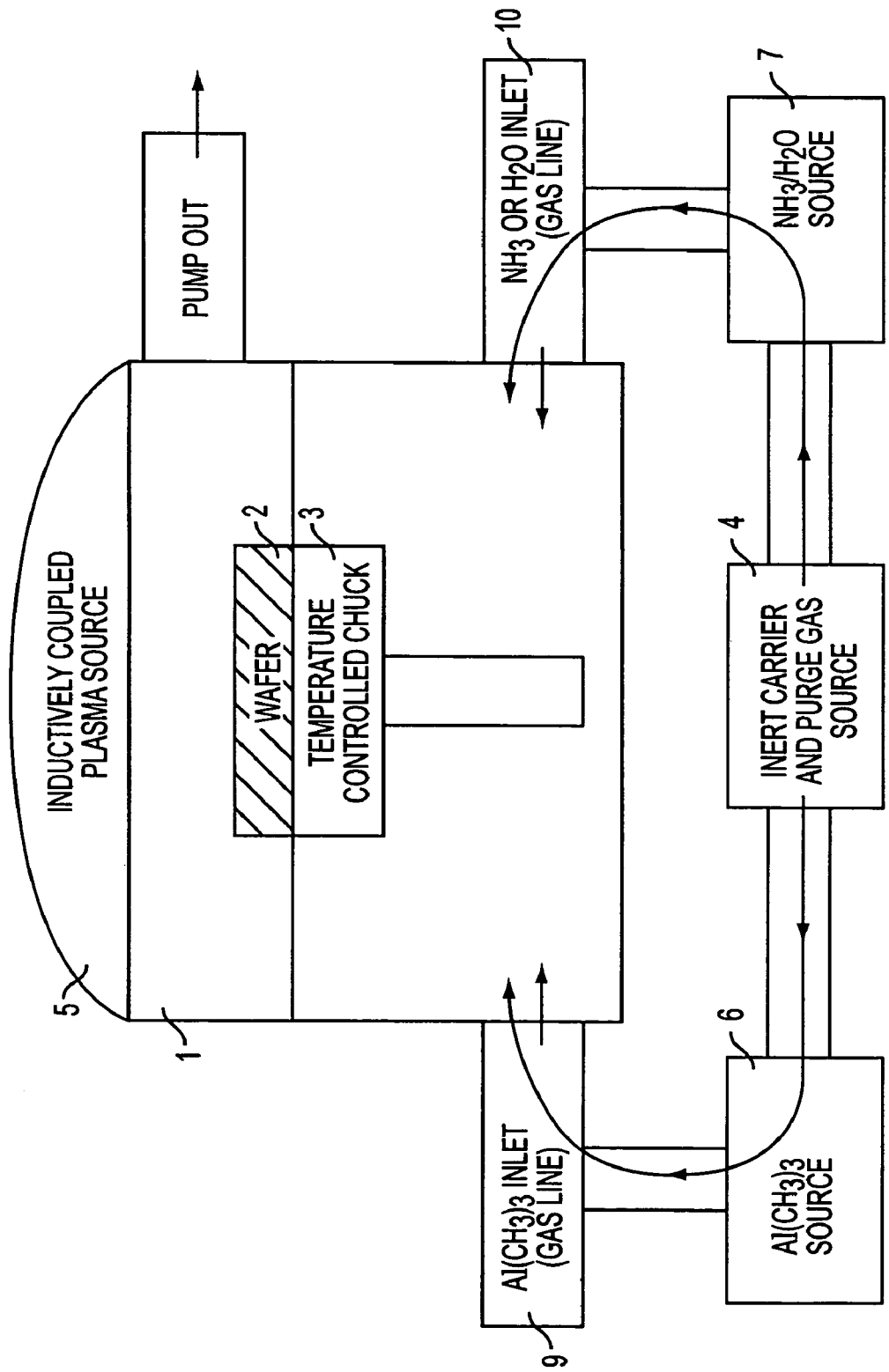
FIG. 3D is a graphical illustration of purging the FIG. 3C chamber after the second processing sequence.

FIG. 3D graphically illustrates the introduction of an inert gas 4 i.e., Ar, through heated gas lines 9 and 10, to purge heated gas lines 9 and 10 and reaction vessel 1. The non-reactive gas 4 enters reaction vessel 1 through heated gas lines 9 and 10 at a rate of approximately 50 sccm. The non-reactive gas 4 serves to remove the reacted $CH_4$ and residual $H_2O$ 7. Again, as mentioned in previous paragraphs, the inert purge gas 4 need only be supplied through heated gas line 10 if desired.

Figure 3E:
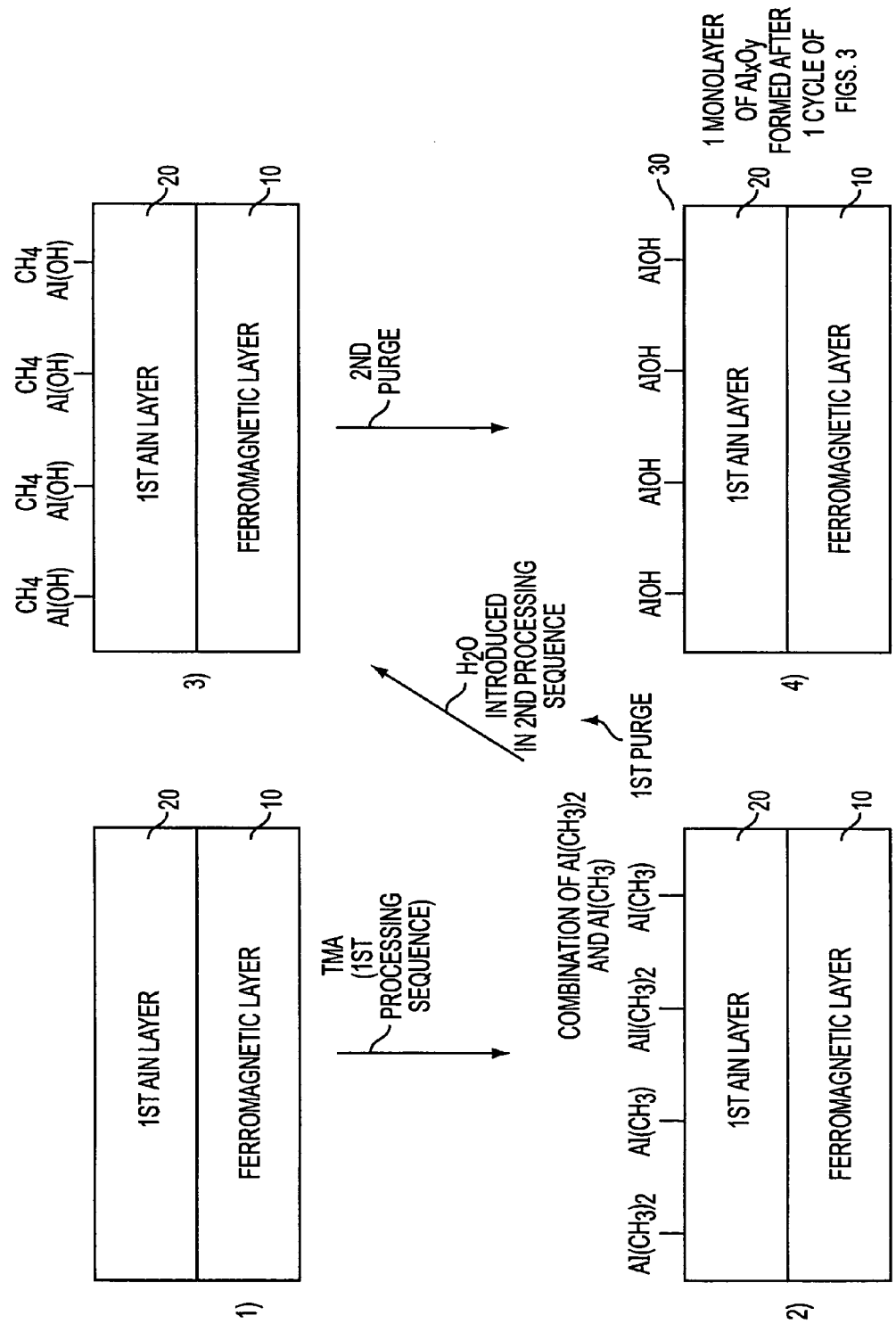
FIG. 3E is a cross-sectional view of the formation of the intermediate junction layer, formed over the first nitride junction layer, conducted in accordance with the processes depicted in FIGS. 3A-3D.

FIG. 3E is a cross-sectional view of the formation of the $Al_xO_y$ intermediate oxide junction layer after one cycle of the processing sequences depicted in FIGS. 3A-3D are carried out. The introduction of $H_2O$ into reaction vessel 1, produces an $Al_xO_y$ monolayer by reacting with the TMA as depicted in FIG. 3E(4). The bond formation between the hydroxyl groups (OH) and Al is a far more stable bond (i.e., more energetically favorable) than the C and Al bond of TMA. $H_2O$ encounters the Al—$CH_3$ bond and the Al—OH bond is energetically more favorable driving the disassociation reaction of the methyl groups from Al and OH groups from H. Thus, the Al—OH bond forms leaving $CH_3$ which disassociates and picks up the other hydrogen from the Al—OH reaction leaving $CH_4$ as the by-product as depicted in FIG. 3E(3). The second purge, as depicted in FIG. 3D, removes the reacted $CH_4$ and residual unreacted reactants from reaction vessel 1, leaving a continuous monolayer of $Al_xO_y$ (FIG. 3E(4)). The surface chemical reactions are well-known in the art.

FIGS. 3A-3E respectively illustrates one continuous monolayer of the $Al_xO_y$ layer after one processing cycle has been completed. The processing sequences in FIGS. 3A-3D can be repeated to fabricate additional monolayers to the $Al_xO_y$ layer until a desired thickness is achieved. Although the embodiment of the invention illustrated in FIGS. 3A-3D deposits Al first, and then OH second to form an $Al_xO_y$ monolayer, the process can also be modified to deposit OH first rather than second. Thus, $H_2O$ 7 can be utilized as the initial reactant, as depicted in FIG. 3C, in forming the intermediate oxide junction layer ($Al_xO_y$). After the OH depositions, reaction vessel 1 is purged as depicted in FIG. 3D. Following this, TMA 6 is introduced, as depicted in FIG. 3A, and then reaction vessel 1 is purged, as shown in FIG. 3B, to complete one monolayer of $Al_xO_y$.

As a result, the processing sequences depicted in FIGS. 3A-3D, results in an anatomically smooth monolayer of approximately 0.8 to approximately 1 Angstrom (A°) of $Al_xO_y$ deposited on the first nitride junction layer 20 of wafer 2 (FIG. 3E(1)). As noted, the process flow, depicted in FIGS. 3A-3D, can be repeated any number of times as desired to fabricate additional monolayers of $Al_xO_y$ provided on the first nitride junction layer 20, to achieve the desired thickness of the intermediate oxide junction layer i.e., $Al_xO_y$. Typically, approximately 1 to approximately 68 monolayers of $Al_xO_y$ is sufficient to form the intermediate oxide junction layer. As a result, the total thickness of the $Al_xO_y$ layer is approximately 0.8 A° to approximately 58 A°. However, the thickness of the $Al_xO_y$ layer can be tailored to provide the required magnetoresistance for any given device.

The completed $Al_xO_y$ intermediate oxide junction layer can then be thermally annealed at a temperature of approximately 200° C. to approximately 250° C., for approximately one to approximately ten minutes, in a $N_2$ or $O_2$ atmosphere. Alternatively, an $O_2$ or $N_2$ plasma can be utilized rather than a thermal anneal. It is preferred that the $Al_xO_y$ intermediate oxide junction layer is thermally annealed in a $N_2$ atmosphere to reduce the chance of oxidation. The process step of thermally annealing the $Al_xO_y$ intermediate oxide junction layer, is to improve film density and reduce pinholing. The thermal anneal releases any unreacted reactants and drives out any trapped hydrogen; thereby, reducing the number of impurities present in the intermediate oxide junction layer. This process results in a tunnel junction barrier that has two completed layers, the first nitride junction layer 20 and the intermediate oxide junction layer 30 depicted in FIG. 3E(4). The combined thickness of these layers are approximately 1.6 A° to approximately 59 A°.

Figure 4:
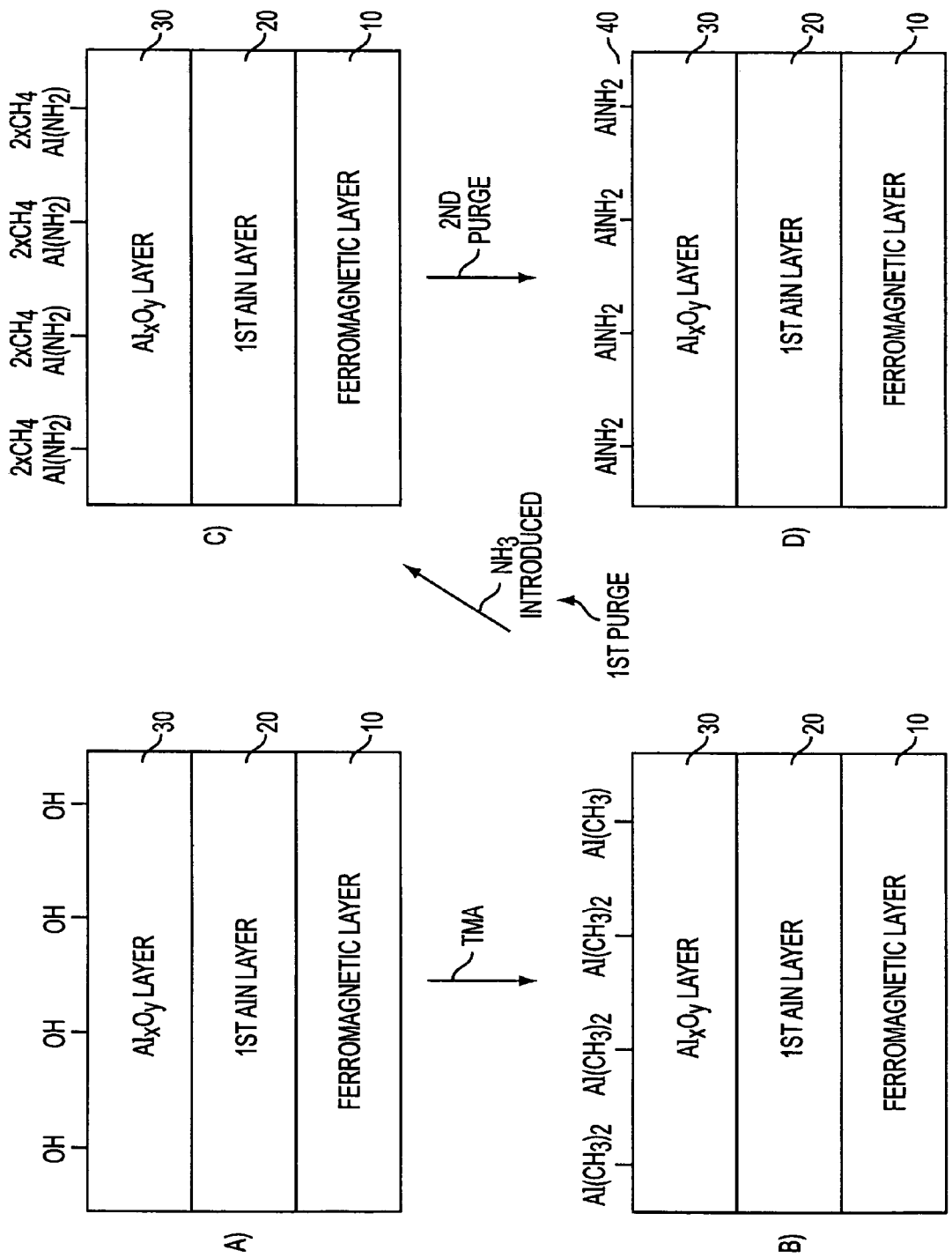
FIG. 4 is a cross-sectional view of the final reaction sequence used in formation of the second nitride junction layer conducted in accordance with the processes depicted in FIGS. 2A-2D.

Referring now to FIG. 4, after formation of the $Al_xO_y$ intermediate oxide junction layer 30 to a desired thickness, a second nitride junction layer 40 is provided on top of the $Al_xO_y$ intermediate oxide junction layer 30. For purposes of a simplified description, the invention will be described below with use of AlN as the second nitride junction layer 40. However, similar nitride layers such as $Si_xN_y$, TiN, HfN, TaN, and other alternative nitride layers known in the art, can also be used to form the second nitride junction layer 40.

The second nitride junction layer 40 is an AlN nitride junction layer provided on the intermediate oxide junction layer 30 described above. The AlN second nitride junction layer 40 is formed utilizing the same processing sequences depicted in FIGS. 2A-2D, and as described in preceding paragraphs 42 to 55 prior to deposition of the top ferromagnetic layer. The thickness of the AlN second nitride junction layer 40 can be tailored to any magnetoresistance that would be required for any given device.

An additional embodiment of the present invention does not utilize the sequences depicted in FIGS. 2C-2D in completing formation of the second nitride junction layer 40. It is preferred that the second nitride junction layer 40 react with $NH_3$ 7 to avoid exposure to $O_2$ or other materials on its way to undergoing a plasma anneal. FIGS. 2A-2D depict processing sequences where Al atoms 6 are first deposited followed by N atom depositions 7. However, the processes depicted in FIGS. 2C-2D involving N atoms depositions 7 in reaction vessel 1 can be eliminated by utilizing an alternative processing sequence.

For example, Al atoms 6 are first deposited as depicted in FIGS. 2A-2B. These Al atoms 6 do not need to subsequently react with $NH_3$ 7 to form the second nitride junction layer, as depicted in FIGS. 2C-2D, if an alternative processing sequence is used that ignites a $N_2$ plasma to densify the film such as a plasma anneal. This alternative processing step serves to provide the necessary N atoms in forming the second AlN nitride junction monolayer when the processing steps depicted in FIGS. 2C-2D are not utilized.

It is preferred that the resulting second AlN nitride junction layer 40, FIG. 4(d), undergo a plasma anneal to improve the overall performance of the dielectric tunnel barrier. The plasma anneal processing step is preferred whether FIGS. 2A-2D are utilized, or FIGS. 2A-2B are utilized in forming the second nitride AlN monolayer. The plasma anneal processing step ensures pinhole free dense tunnel barrier films, reduces impurities (unreacted reactants), and stabilizes the tunnel barrier film against high temperatures and humidity.

Figure 5:
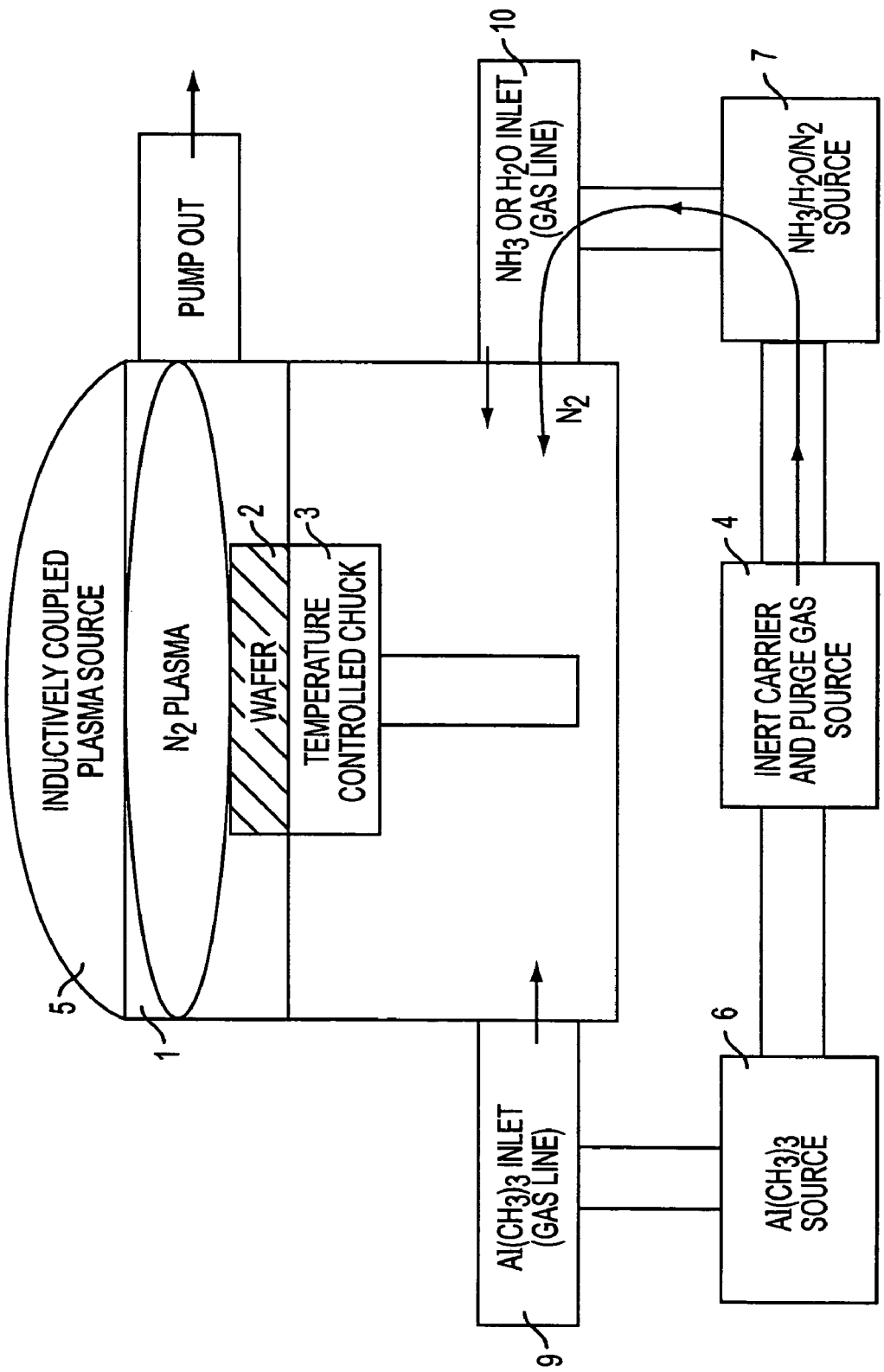
FIG. 5 is a graphical illustration of plasma annealing the second nitride junction layer formed in accordance with the processes depicted in FIGS. 2A-2D.

FIG. 5 graphically illustrates a plasma anneal process on the second AlN nitride junction layer after the desired thickness of the multilayer film has been achieved. The plasma densification process is not used on the first two layers (the first nitride junction layer and the intermediate oxide junction layer) of the dielectric tunnel barrier device in order to avoid damaging the bottom ferromagnetic layer. The first nitride junction layer and intermediate oxide junction layer undergo thermal anneals and do not require the step of plasma densification as the second nitride junction layer does.

The plasma densification process, conducted only on the second nitride junction layer, can be carried out in the reaction vessel 1 of FIG. 1, as depicted in FIG. 5, or in a separate chamber with an Rf, microwave plasma, or glow discharge source. The reaction vessel 1 (or separate chamber) is back-filled with $N_2$ 7 and the inductively coupled plasma source 5, at the top of reaction vessel 1 is started.

Figure 6:
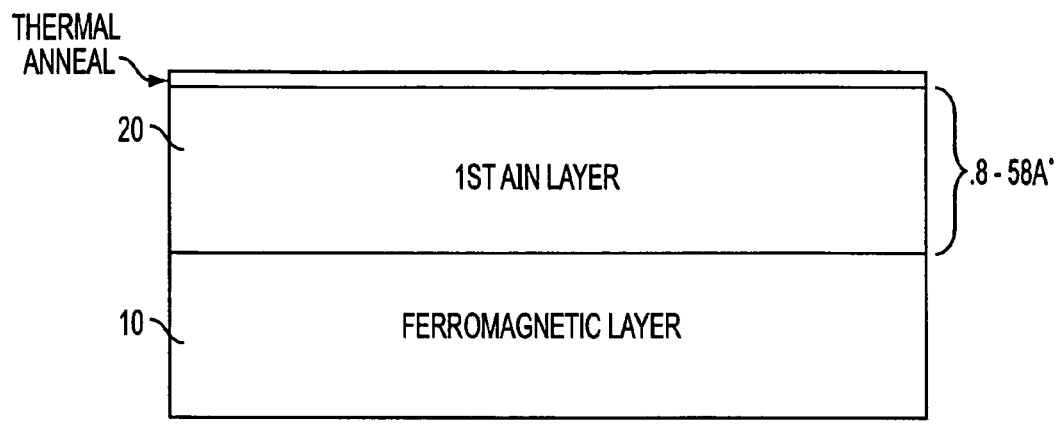
FIG. 6 is a cross-sectional view of a magnetic tunnel junction barrier film constructed in accordance with the processes depicted in FIGS. 2A-2D.
Figure 7:
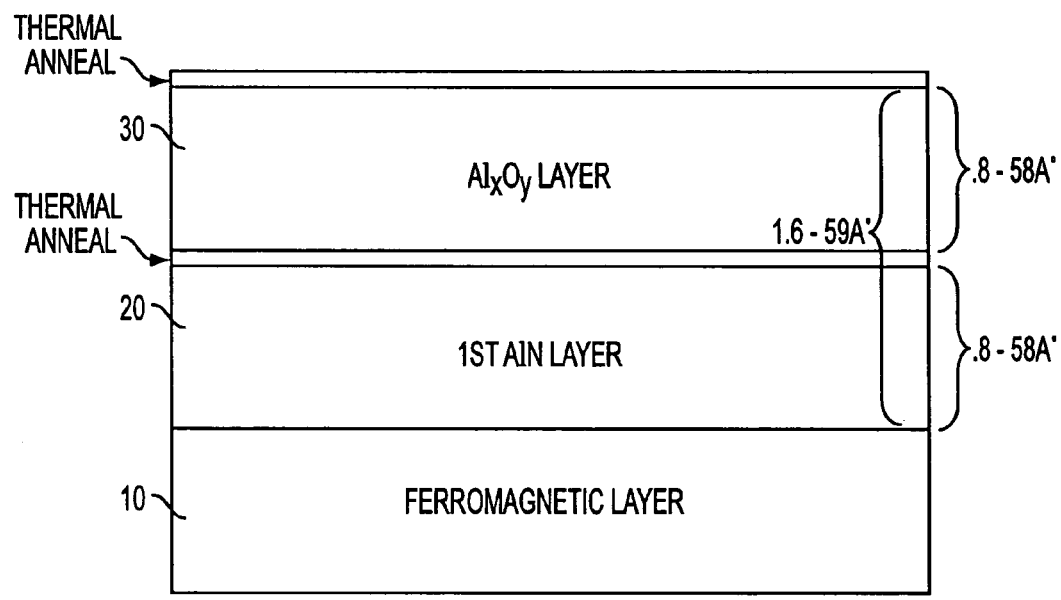
FIG. 7 is a cross-sectional view of a magnetic tunnel junction barrier film and the formation of the intermediate junction layer constructed in accordance with the processes depicted in FIGS. 3A-3D.

FIGS. 6-9 are cross-sectional views of the different alternating layers of a tunnel barrier structure created by utilizing the processing sequences depicted in FIGS. 1-5. FIG. 6 is a cross-sectional view after the first nitride junction layer 20 i.e., AlN, is formed over the bottom ferromagnetic layer 10 and thermally annealed. FIG. 6 depicts that the first nitride junction layer's 20 thickness can range from approximately 0.8 A° to approximately 58 A°. FIG. 7 is a cross-sectional view after the intermediate oxide junction layer 30 i.e., $Al_xO_y$, is formed over the first nitride junction layer 20 and thermally annealed. FIG. 7 depicts that the intermediate oxide junction layer 30 can range from approximately 0.8 A° to approximately 58 A° in thickness. FIG. 7 also depicts that the combined thickness of the intermediate oxide junction layer 30 and the first nitride junction layer is approximately 1.6 A° to approximately 59 A°.

Figure 8:
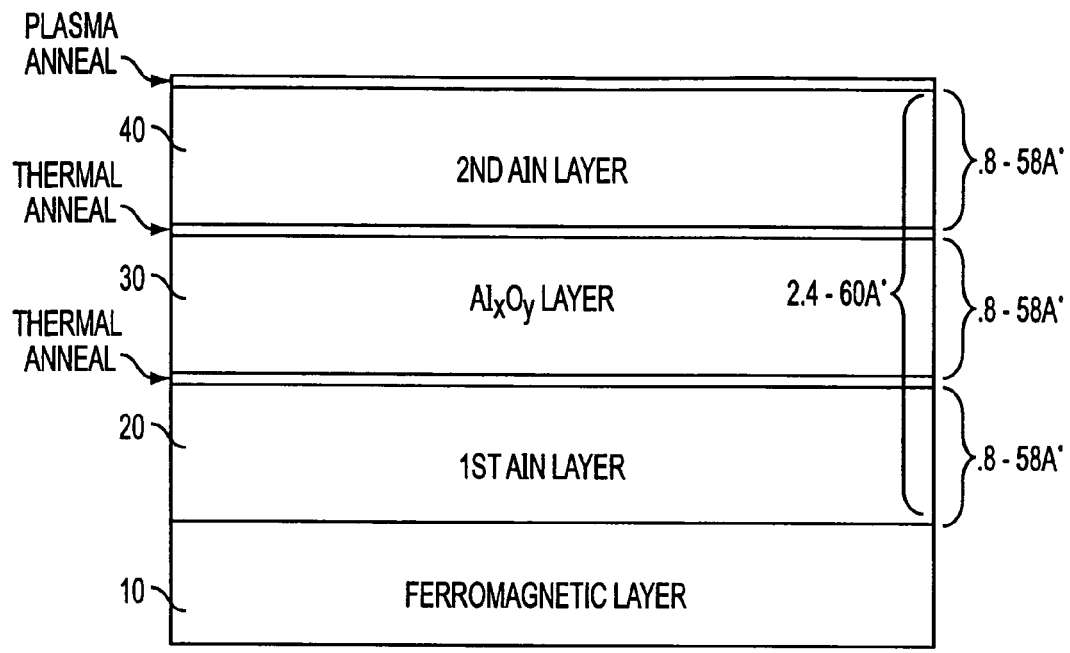
FIG. 8 is a cross-sectional view of a magnetic tunnel junction barrier film and the formation of the second nitride junction layer constructed in accordance with the processes depicted in FIGS. 2A-2D.
Figure 9:
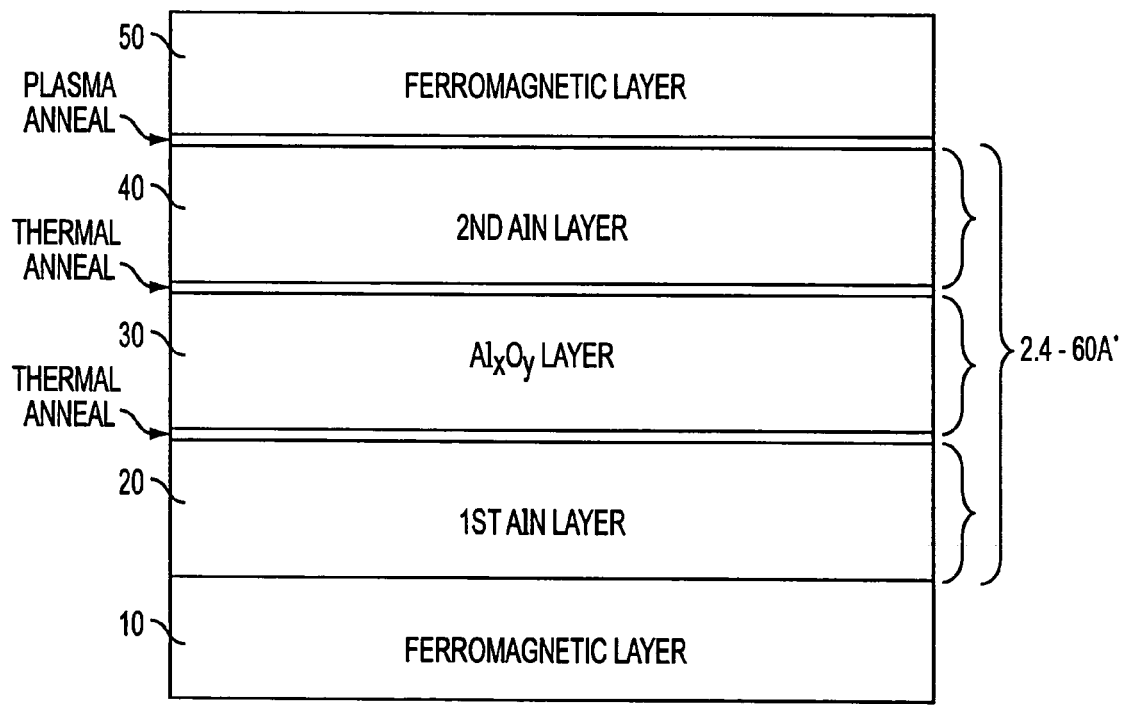
FIG. 9 is a cross-sectional view of a multilayer magnetic tunnel junction barrier film constructed in accordance with the present invention.

FIG. 8 is a cross-sectional view after the second nitride junction layer 40 i.e., AlN, which is provided on the intermediate oxide junction layer 30, after undergoing a nitrogen plasma anneal process. FIG. 8 depicts that the second nitride junction layer 40 can range from approximately 0.8 A° to approximately 58 A° in thickness. FIG. 9 is a cross-sectional view of a magnetic tunnel barrier device, constructed utilizing the methods of the present invention. As shown, a pair of ferromagnetic layers 10 and 50, are separated by a multilayer tunnel junction barrier (20, 30, 40) constructed as described above. FIG. 9 depicts that the completed multilayer tunnel junction barrier (20,30, 40) can range from approximately 2.4 A° to approximately 60 A° in total thickness.

Figure 10:
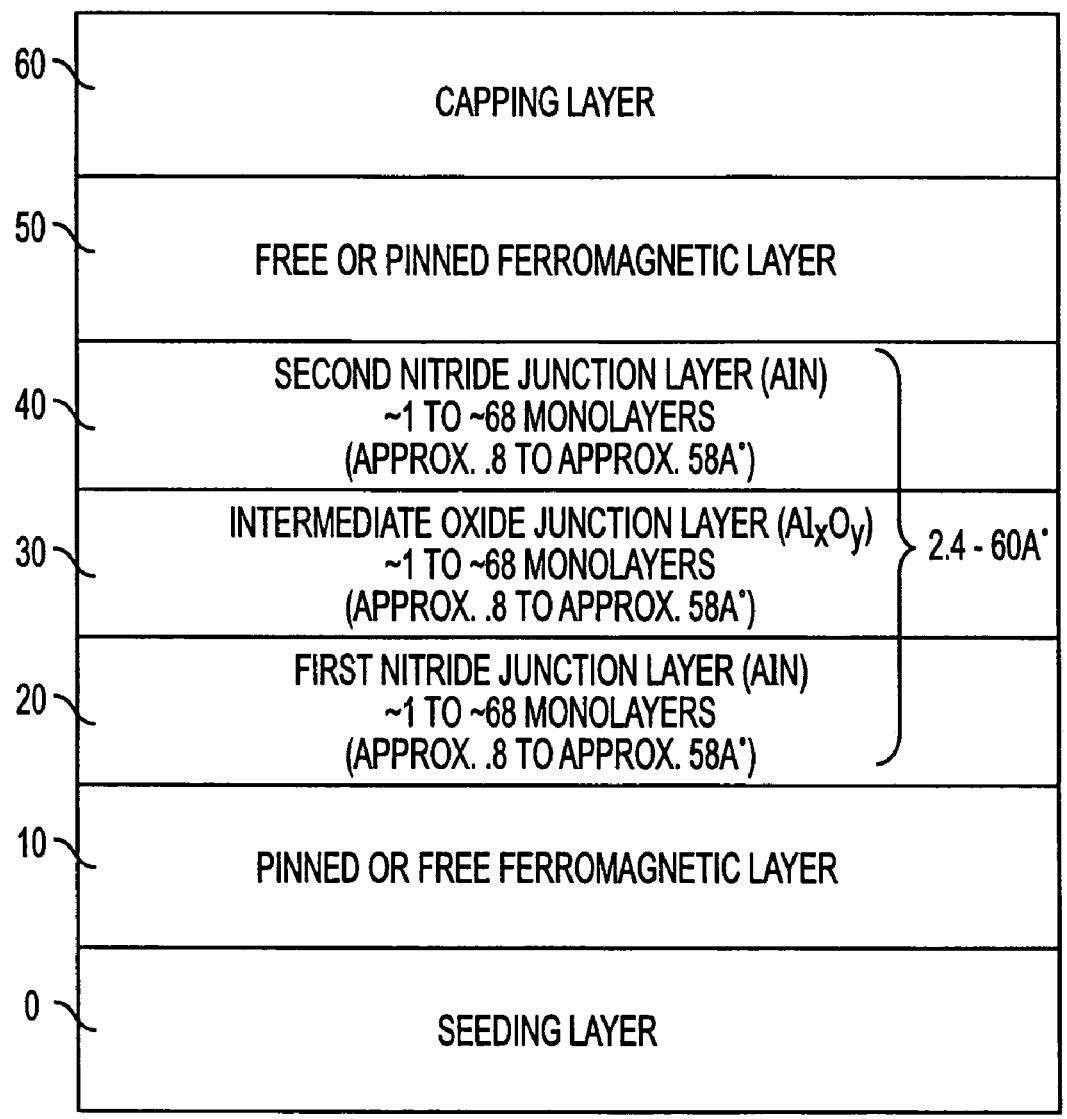
FIG. 10 is a cross-sectional view of a magnetic tunnel junction device constructed in accordance with the present invention.

FIG. 10 is a cross-sectional view of a magnetic tunnel junction memory element suitable for use in an MRAM memory device utilizing the multilayer dielectric tunnel barrier (20, 30, 40) constructed in accordance with the present invention. The multilayer tunnel barrier (20, 30, 40) interfaces with two ferromagnetic film layers (10 and 50), one of which is pinned and the other of which is free. Although alternating individual nitride-oxide-nitride layers (20, 30, 40) each have a thickness of approximately 0.8 A° to approximately 58 A°, the overall thickness of the multilayer tunnel barrier (20, 30, 40) constructed in accordance with the present invention, does not exceed approximately 60 A°. Whereas, the multilayer tunnel barrier (20,30, 40) can be as thin as approximately 2.4 A° thick. The top and bottom ferromagnetic layers (10 and 50) may also interface with a capping 60 and seeding layer 0 respectively, depending on the device that will utilize the multilayer tunnel barrier (20,30, 40).

Figure 11:
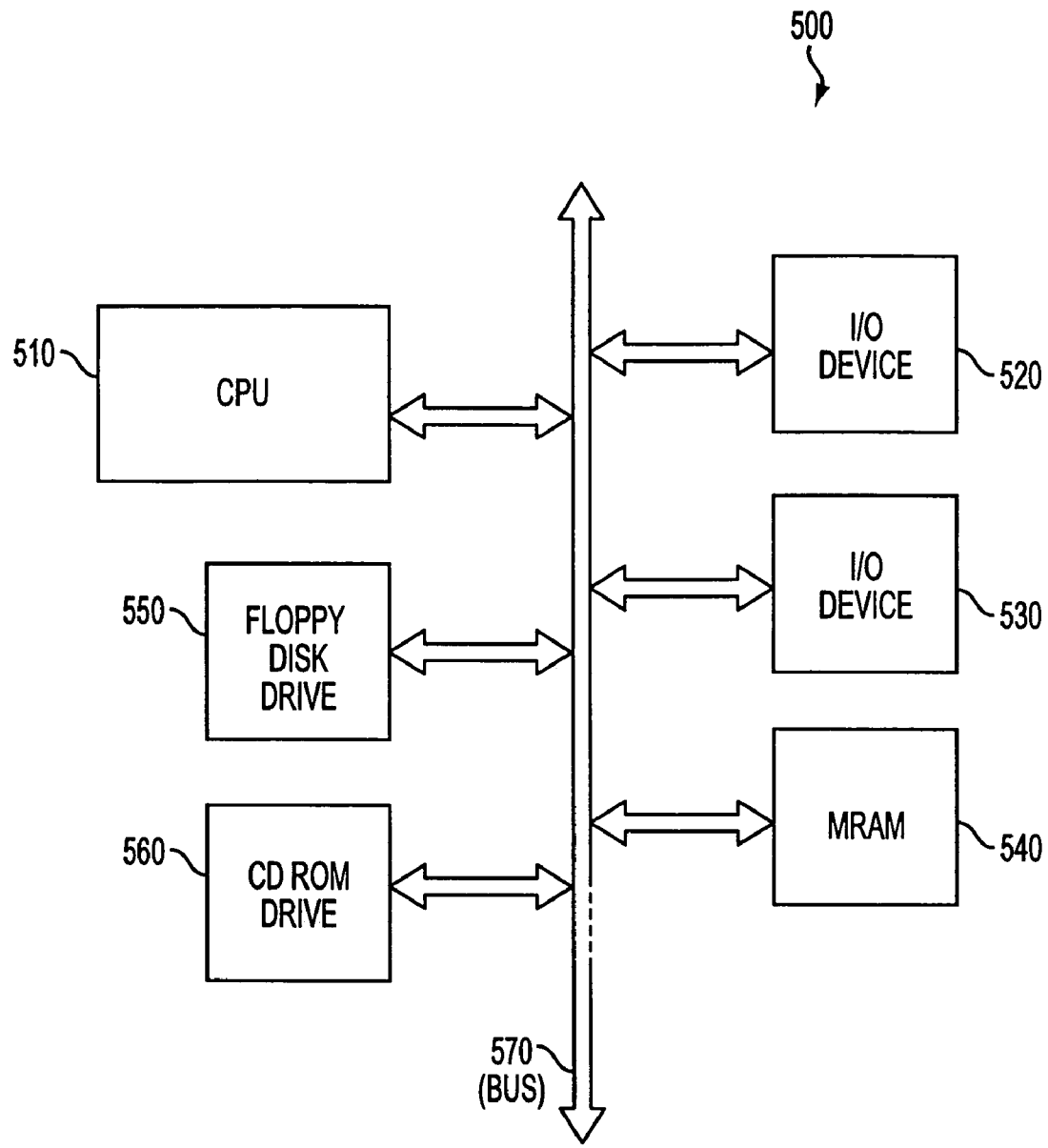
FIG. 11 is a block diagram of a system utilizing a magnetic tunnel junction device constructed in accordance with the present invention.

FIG. 11 is a block diagram of a processor system utilizing the multilayer dielectric tunnel barrier structure as described above. The processor system 500 may be a computer system comprising CPU 510 which exchanges data with an MRAM memory element 540 containing memory cells constructed as described above. The MRAM memory element 540 communicates with CPU 510 over one or more buses and/or bridges 570 directly or through a memory controller. The buses and/or bridges 570 also allow the CPU 510 to internally communicate with I/O devices 520, 530, read-only memory (ROM) devices 540, and peripheral devices such as a floppy disk drive 550 and a compact disk CD-ROM drive 560, as is well known in the art.

The present invention also provides a magnetic memory device such as a storage cell which can be fabricated with a multilayer tunnel barrier that is comprised of only two monolayers of AlN and one monolayer of $Al_xO_y$, with a combined overall thickness of approximately 2.4 A° to approximately 3 A°.

The multilayer tunnel barrier fabricated utilizing the methods described above, has reduced pinholes, improves signal levels, improves overall device speed, and provides anatomically smooth surfaces. As a result, any combination of the thicknesses of the respective alternating layers of nitride i.e., AlN, and oxide i.e., $Al_xO_y$, can be used depending upon the device that will utilize the present invention. The only limiting factor is that the resulting tunnel barrier structure possess a minimum thickness of approximately 2.4 A° and a maximum thickness of approximately 60 A°.

The present invention is equally effective with alternating layers of nitride-oxide-nitride that are equal in thickness to each other. As a result, the tunnel barrier can be tuned (i.e., the magnetoresistance) by choosing the thicknesses of each alternating layer within a nitride or oxide layer or the nitride or oxide layer itself. Examples of using the present invention include creation of a tunnel barrier that has a 4 A° AlN layer (a first nitride junction layer), 4 A° AlN layer (an intermediate oxide junction layer), and a 2 A° AlN layer (a second nitride junction layer). Other possibilities include a tunnel barrier having different layers of thickness such as: 6 A° AlN, 10 A° $Al_xO_y$, and 6 A° AlN; a 20 A° AlN, 5 A° $Al_xO_y$, and 30 A° AlN; 4 A° AlN, 4° $Al_xO_y$, and 4 A° AlN; 2 A° AlN, 6 A° $Al_xO_y$, and 2 A° AlN; 4 A° AlN, 10 A° $Al_xO_y$, and 4 A° AlN; and 20 A° AlN, 40 A° $Al_xO_y$, and 20 A° AlN for instance.

As a result, a multitude of combinations can result by utilizing the present invention and methods described above depending upon the device that the tunnel barrier is being created for i.e., the magnetoresistance desired. For instance, if one wanted to make a tunneling curve very lopsided from negative potential to positive potential, one could use different thicknesses of AlN (the first and second nitride junction layers) which would change the tunneling characteristics depending on the direction of tunneling through the device. If electrons pass from bottom to top rather than top to bottom, the electrons will encounter a very different tunnel barrier shape. In addition, to increase the total resistance of the device utilizing the present invention, the intermediate oxide junction layer i.e., $Al_xO_y$ layer, can be made thicker. Thus, the present invention allows one to tune the resistance of any given magnetic device utilizing the multilayer tunnel barrier as described above.

The present invention also provides a method and structure capable of simultaneously reducing the overall resistance of the tunnel barrier, and the occurrence of pinhole formation, while permitting films of various thickness to be formed. The dielectric tunnel barriers conformality and surface smoothness, is substantially enhanced compared to those dielectric tunnel barriers associated with conventional structures and methods. The ALD process leaves the interfaces of the tunnel barrier structure as pristine as possible by avoiding metal mixing and overoxidation from a plasma source. Furthermore, the ALD deposition techniques allows a multilayer tunnel barrier to be very thin improving signal levels and overall device speeds.

The present invention also provides more precise stoichiometric control over the two nitride and oxide films and barrier height. Although the invention has been described and illustrated as being suitable for use in a memory application, an application for example, as in an MRAM device; the invention is not limited to MRAM applications. Rather, the invention and methods described in previous paragraphs, could be employed in any processor system in which an enhanced tunneling characteristic of a magnetic tunnel junction is desired.

Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the following claims.

What is claimed as new and desired to be protected by Letters Patent of the United States is:

1. A multi-layer tunnel barrier structure comprising:
   a magnetic layer over a substrate;
   at least one first nitride layer over said magnetic layer, wherein said first nitride layer comprises at least one atomic monolayer;
   at least one intermediate oxide layer over the at least one first nitride layer, wherein said intermediate oxide layer comprises at least one atomic monolayer; and at least one second nitride layer over said at least one intermediate oxide layer, wherein said second nitride layer comprises at least one atomic monolayer.

2. A structure as in claim 1, wherein said at least one first nitride layer comprises AlN.

3. A structure as in claim 1, wherein said at least one first nitride layer has a thickness of approximately 0.8 Å.

4. A structure as in claim 1, wherein said at least one first nitride layer further comprises a plurality of first nitride layers, wherein said plurality of first nitride layers are from about 0.8 Å to approximately 58 Å thick.

5. A structure as in claim 1, wherein said at least one intermediate oxide layer comprises $Al_xO_y$, HfO, $Ta_2O_5$, $SiO_2$, or combinations thereof.

6. A structure as in claim 5, wherein said at least one intermediate oxide layer has a thickness of approximately 0.8 Å.

7. A structure as in claim 1, wherein said at least one intermediate oxide layer further comprises a plurality of intermediate oxide layers, wherein said plurality of intermediate oxide layers are from about 0.8 Å to approximately 58 Å thick.

8. A structure as in claim 1, wherein said at least one intermediate oxide layer and said at least one first nitride layer have a combined thickness of from about 1.6 Å to approximately 59 Å.

9. A structure as in claim 1, wherein said at least one second nitride layer comprises AlN.

10. A structure as in claim 9, wherein said at least one second nitride layer has a thickness of approximately 0.8 Å.

11. A structure as in claim 1, wherein said at least one second nitride layer further comprises a plurality of second nitride layers, wherein said plurality of second nitride layers are from about 0.8 Å to approximately 58 Å thick.

12. A structure as in claim 1, wherein the at least one second nitride layer, the at least one intermediate oxide layer and the at least one first nitride layer have a combined thickness of from about 2.4 Å to approximately 59 Å.

13. A structure as in claim 1, wherein the at least one second nitride layer, the at least one intermediate oxide layer and the at least one first nitride layer, are made up of a plurality of atomic monolayers.

14. A structure as in claim 1, wherein the at least one first and second nitride layers are approximately 4 Å thick and the at least one intermediate oxide layer is approximately 4 Å thick.

15. A structure as in claim 1, wherein the at least one first and one second nitride layers are approximately 2 Å thick and the at least one intermediate oxide layer is approximately 6 Å thick.

16. A structure as in claim 1, wherein the at least one first and one second nitride layers are approximately 4 Å thick and the at least one intermediate oxide layer is approximately 10 Å thick.

17. A structure as in claim 1, wherein the at least one first and one second nitride layers are approximately 20 Å thick and the at least one intermediate oxide layer is approximately 40 Å thick.

18. A system comprising:
a processor; and
a memory device coupled to said processor, at least one of said processor and said memory device comprising a tunnel barrier structure, said tunnel barrier structure comprising:
a magnetic layer over a substrate;
at least one first nitride layer over said magnetic layer, wherein said first nitride layer comprises at least one atomic monolayer;
at least one non-nitride intermediate layer over the at least one first nitride layer, wherein said non-nitride intermediate layer comprises at least one atomic monolayer; and
at least one second nitride layer over said at least one intermediate oxide layer, wherein said second nitride layer comprises at least one atomic monolayer.

19. A system as in claim 18, wherein said at least one first nitride layer has a thickness of approximately 0.8 Å.

20. A system as in claim 18, wherein said at least one first nitride layer further comprises a plurality of first nitride layers, wherein said plurality of first nitride layers are from about 0.8 Å to approximately 58 Å thick.

21. A system as in claim 18, wherein said at least one non-nitride intermediate layer has a thickness of approximately 0.8 Å.

22. A system as in claim 18, wherein said at least one non-nitride intermediate layer further comprises a plurality of non-nitride intermediate layers, wherein said plurality of non-nitride intermediate layers are from about 0.8 Å to approximately 58 Å thick.

23. A system as in claim 18, wherein said at least one non-nitride intermediate layer and said at least one first nitride layer have a combined thickness of from about 1.6 Å to approximately 59 Å thick.

24. A system as in claim 18, wherein said at least one second nitride layer has a thickness of approximately 0.8 Å.

25. A system as in claim 18, wherein said at least one second nitride layer further comprises a plurality of second nitride layers, wherein said plurality of second nitride layers are from about 0.8 Å to approximately 58 Å thick.

26. A tunnel barrier structure, comprising:
at least one magnetic layer over a substrate;
at least one first nitride layer comprising an atomic monolayer over said at least one magnetic layer;
at least one non-nitride intermediate layer comprising an atomic monolayer over said at least one first nitride layer; and
at least one second nitride layer comprising an atomic monolayer over said at least one non-nitride intermediate layer.

27. A structure as in claim 26, wherein said at least one first nitride layer comprises AlN.

28. A structure as in claim 26, wherein said at least one first nitride layer has a thickness of approximately 0.8 Å.

29. A structure as in claim 26, wherein said at least one first nitride layer further comprises a plurality of first nitride layers, wherein said plurality of first nitride layers are from about 0.8 Å to approximately 58 Å thick.

30. A structure as in claim 26, wherein said at least one non-nitride intermediate layer comprises an oxide.

31. A structure as in claim 30, wherein said oxide comprises $Al_xO_y$, HfO, $Ta_2O_5$, $SiO_2$, or combinations thereof.

32. A structure as in claim 26, wherein said at least one non-nitride intermediate layer has a thickness of approximately 0.8 Å.

33. A structure as in claim 26, wherein said at least one non-nitride intermediate layer further comprises a plurality of non-nitride intermediate layers, wherein said plurality of non-nitride intermediate layers are from about 0.8 Å to approximately 58 Å thick.

34. A structure as in claim 26, wherein the at least one first nitride layer and the at least one non-nitride intermediate layer are from about 1.6 Å to approximately 59 Å thick.

35. A structure as in claim 26, wherein said at least one second nitride layer comprises AlN.

36. A structure as in claim 26, wherein said at least one second nitride layer has a thickness of approximately 0.8 Å.

37. A structure as in claim 26, wherein said at least one second nitride layer further comprises a plurality of second nitride layers, wherein said plurality of second nitride layers are from about 0.8 Å to approximately 58 Å thick.

38. A structure as in claim 26, wherein the at least one first nitride layer, the at least one non-nitride intermediate layer, and the at least one second nitride layer, are from about 2.4 Å to approximately 59 Å thick.

39. A structure as in claim 26, wherein the at least one first and one second nitride layers are approximately 4 Å thick and the at least one non-nitride intermediate layer is approximately 4 Å thick.

40. A structure as in claim 26, wherein the at least one first and one second nitride layers are approximately 2 Å thick and the at least one non-nitride intermediate layer is approximately 6 Å thick.

41. A structure as in claim 26, wherein the at least one first and one second nitride layers are approximately 4 Å thick and the at least one non-nitride intermediate layer is approximately 10 Å thick.

42. A structure as in claim 26, wherein the at least one first and one second nitride layers are approximately 20 Å thick and the at least one non-nitride intermediate layer is approximately 40 Å thick.

43. A semiconductor device, comprising:
   a magnetic material over a substrate;
   at least one first nitride material over said magnetic material, wherein said first nitride material comprises at least one atomic monolayer;
   at least one intermediate oxide material over the at least one first nitride material, wherein said intermediate oxide material comprises at least one atomic monolayer; and
   at least one second nitride material over said at least one intermediate oxide material, wherein said second nitride material comprises at least one atomic monolayer.

44. The semiconductor device of claim 43, wherein said at least one first nitride material comprises AlN.

45. The semiconductor device of claim 43, wherein said at least one first nitride material further comprises a plurality of first nitride layers, wherein said plurality of first nitride layers are from about 0.8 Å to approximately 58 Å thick.

46. The semiconductor device of claim 43, wherein said at least one intermediate oxide material comprises $Al_xO_y$, HfO, $Ta_2O_5$, $SiO_2$, or combinations thereof.

47. A tunnel barrier structure, comprising:
   at least one magnetic material over a substrate;
   at least one first nitride material comprising atomic monolayers over said at least one magnetic material;
   at least one non-nitride intermediate material comprising an atomic monolayer over said at least one first nitride material; and
   at least one second nitride material comprising an atomic monolayer over said at least one non-nitride intermediate material.

48. The tunnel barrier structure of claim 47, wherein said at least one first nitride material comprises AlN.

49. The tunnel barrier structure of claim 47, wherein said at least one non-nitride intermediate material comprises $Al_xO_y$, HfO, $Ta_2O_5$, $SiO_2$, or combinations thereof.

50. The tunnel barrier structure of claim 47, wherein said at least one first nitride material further comprises a plurality of first nitride layers, wherein said plurality of first nitride layers are from about 0.8 Å to approximately 58 Å thick.

* * * * *